(12) United States Patent
Hovis et al.

(10) Patent No.: US 11,710,726 B2
(45) Date of Patent: Jul. 25, 2023

(54) THROUGH-BOARD POWER CONTROL ARRANGEMENTS FOR INTEGRATED CIRCUIT DEVICES

(71) Applicant: Microsoft Technology Licensing, LLC, Redmond, WA (US)

(72) Inventors: William Paul Hovis, Sammamish, WA (US); Gregory M. Daly, Seattle, WA (US); Rich Tat An, Renton, WA (US); Andres Felipe Hernandez Mojica, Seattle, WA (US); Garrett Douglas Blankenburg, Sammamish, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 779 days.

(21) Appl. No.: 16/451,414

(22) Filed: Jun. 25, 2019

(65) Prior Publication Data

US 2020/0411494 A1   Dec. 31, 2020

(51) Int. Cl.
*G06F 1/26* (2006.01)
*G06F 1/32* (2019.01)
(Continued)

(52) U.S. Cl.
CPC .......... *H01L 25/18* (2013.01); *G01R 31/2896* (2013.01); *G06F 1/3296* (2013.01);
(Continued)

(58) Field of Classification Search
CPC ........ G06F 1/26; G06F 1/3296; G06F 9/4406; H01L 2223/6666; H01L 2224/16146;
(Continued)

(56) References Cited

U.S. PATENT DOCUMENTS 6,075,285 A * 6/2000 Taylor ................... H01L 23/642
257/691
6,351,369 B1   2/2002 Kuroda et al.
(Continued)

FOREIGN PATENT DOCUMENTS

GB   2408116 A   5/2005
WO   02076166 A1   9/2002

OTHER PUBLICATIONS

"International Search Report and Written Opinion Issued in PCT Application No. PCT/US20/031249", dated Jul. 23, 2020, 11 Pages.
(Continued)

*Primary Examiner* — Nitin C Patel

(57) ABSTRACT

Power control and decoupling capacitance arrangements for integrated circuit devices are discussed herein. In one example, an assembly includes a first circuit assembly comprising a first circuit board coupled to an integrated circuit device, wherein the first circuit board is coupled to first surface of a system circuit board. The assembly also includes a second circuit assembly comprising a second circuit board having one or more voltage adjustment units configured to supply at least one input voltage to the integrated circuit device, wherein the second circuit board is coupled to a second surface of the system circuit board and positioned at least partially under a footprint of the integrated circuit device with respect to the system circuit board.

18 Claims, 8 Drawing Sheets

(51) Int. Cl.
  *H01L 25/18* (2023.01)
  *G01R 31/28* (2006.01)
  *G06F 1/3296* (2019.01)
  *H01L 23/48* (2006.01)
  *H01L 23/66* (2006.01)
  *H01L 23/00* (2006.01)
  *H05K 1/11* (2006.01)
  *H05K 1/18* (2006.01)
  *G06F 9/4401* (2018.01)

(52) U.S. Cl.
  CPC ............ *H01L 23/481* (2013.01); *H01L 23/66* (2013.01); *H01L 24/16* (2013.01); *H05K 1/113* (2013.01); *H05K 1/181* (2013.01); *G06F 9/4406* (2013.01); *H01L 2223/6666* (2013.01); *H01L 2224/16146* (2013.01); *H05K 2201/10378* (2013.01); *H05K 2201/10545* (2013.01)

(58) Field of Classification Search
  CPC ....... H01L 23/481; H01L 23/66; H01L 24/16; H01L 25/18; H05K 1/113; H05K 1/181; H05K 2201/10378; H05K 2201/10545; Y02D 10/00
  See application file for complete search history.

(56) References Cited

U.S. PATENT DOCUMENTS

| | | | |
|---|---|---|---|
| 6,366,467 B1 | 4/2002 | Patel et al. | |
| 6,414,850 B1 | 7/2002 | Kozak et al. | |
| 6,794,581 B2* | 9/2004 | Smith | H05K 1/141 |
| | | | 29/830 |
| 6,891,258 B1* | 5/2005 | Alexander | H05K 1/0231 |
| | | | 257/691 |
| 6,952,049 B1 | 10/2005 | Ogawa et al. | |
| 8,254,155 B1 | 8/2012 | Crisp et al. | |
| 8,520,402 B1 | 8/2013 | Sivasubramaniam | |
| 9,236,442 B2 | 1/2016 | Bhagavat et al. | |
| 2002/0129974 A1 | 9/2002 | Smith et al. | |
| 2002/0170748 A1 | 11/2002 | Larson | |
| 2003/0156400 A1 | 8/2003 | Dibene et al. | |
| 2004/0022038 A1 | 2/2004 | Figueroa et al. | |
| 2004/0068867 A1 | 4/2004 | Burton | |
| 2004/0124511 A1 | 7/2004 | Li | |
| 2004/0183193 A1 | 9/2004 | Koide et al. | |
| 2005/0087850 A1 | 4/2005 | Nishikawa et al. | |
| 2005/0285243 A1 | 12/2005 | Stone et al. | |
| 2006/0035510 A1 | 2/2006 | Numata et al. | |
| 2006/0231947 A1 | 10/2006 | Hosomi et al. | |
| 2006/0254036 A1 | 11/2006 | Lehtonen et al. | |
| 2007/0253142 A1 | 11/2007 | Radhakrishnan et al. | |
| 2007/0289771 A1 | 12/2007 | Osaka et al. | |
| 2008/0157313 A1 | 7/2008 | Dattaguru et al. | |
| 2008/0157343 A1 | 7/2008 | Dattaguru et al. | |
| 2009/0029630 A1 | 1/2009 | Lim et al. | |
| 2009/0228727 A1* | 9/2009 | Tamura | G06F 1/3296 |
| | | | 713/320 |
| 2009/0267220 A1 | 10/2009 | Kuhlman et al. | |
| 2009/0296360 A1 | 12/2009 | Doblar et al. | |
| 2010/0033938 A1 | 2/2010 | Kitagawa et al. | |
| 2010/0123215 A1 | 5/2010 | Pan et al. | |
| 2010/0265682 A1 | 10/2010 | Martinez et al. | |
| 2013/0087903 A1 | 4/2013 | Cherchali et al. | |
| 2013/0194032 A1 | 8/2013 | Hollis | |
| 2014/0145300 A1 | 5/2014 | Bhagavat et al. | |
| 2014/0175665 A1 | 6/2014 | Kang | |
| 2015/0041955 A1 | 2/2015 | Zerbe et al. | |
| 2016/0254745 A1* | 9/2016 | Lim | H01L 25/16 |
| | | | 327/540 |
| 2017/0086298 A1 | 3/2017 | Chuah et al. | |
| 2017/0181286 A1 | 6/2017 | Campbell et al. | |
| 2017/0357311 A1 | 12/2017 | Hovis et al. | |
| 2018/0158772 A1 | 6/2018 | Tanaka | |
| 2019/0013301 A1 | 1/2019 | Cheah et al. | |
| 2019/0098802 A1 | 3/2019 | Mokler et al. | |
| 2019/0164884 A1 | 5/2019 | Kasamatsu et al. | |
| 2020/0006204 A1 | 1/2020 | Cheah et al. | |
| 2020/0066621 A1 | 2/2020 | Liu et al. | |
| 2020/0373224 A1 | 11/2020 | Daly et al. | |
| 2020/0373260 A1 | 11/2020 | Hovis et al. | |
| 2020/0373285 A1 | 11/2020 | Hovis et al. | |
| 2020/0411495 A1 | 12/2020 | Hovis et al. | |

OTHER PUBLICATIONS

"International Search Report and Written Opinion Issued in PCT Application No. PCT/US20/031548", dated Jul. 10, 2020, 12 Pages.
"Final Office Action Issued In U.S. Appl. No. 16/451,551", dated Dec. 7, 2020, 14 Pages.
"International Search Repod & Written Opinion issued in PCT Application No. PCT/US20/028167", dated Jul. 24, 2020, 13 Pages.
"Final Office Action Issued in U.S. Appl. No. 16/421,675", dated Nov. 3, 2020, 16 Pages.
"Non Final Office Action Issued in U.S. Appl. No. 16/418,038", dated Jun. 16, 2021, 14 Pages.
"Non Final Office Action Issued in U.S. Appl. No. 16/451,551", dated Aug. 26, 2020, 13 Pages.
"International Search Report and Written Opinion Issued in PCT Application No. PCT/US2020/028400", dated Aug. 3, 2020, 12 Pages.
"International Search Report and Written Opinion Issued in PCT Application No. PCT/US2020/028560", dated Jul. 7, 2020, 15 Pages.
"Non Final Office Action Issued in U.S. Appl. No. 16/421,675", dated Jul. 13, 2020, 19 Pages.
"Non Final Office Action Issued in U.S. Appl. No. 16/421,731", dated Jul. 13, 2020, 17 Pages.
"Final Office Action Issued in U.S. Appl. No. 16/418,038", dated Dec. 9, 2021, 13 Pages.
Non Final Office Action Issued in U.S. Appl. No. 16/418,038 dated Apr. 14, 2022, 14 Pages.
"Non Final Office Action Issued in U.S. Appl. No. 16/418,038", dated Nov. 30, 2022, 12 Pages.

* cited by examiner

THROUGH-BOARD POWER CONTROL ARRANGEMENTS FOR INTEGRATED CIRCUIT DEVICES

BACKGROUND

Integrated circuit devices, such as central processor devices, graphics processors, or system-on-a-chip (SoC) devices can be employed in computing systems. These integrated circuit devices can have one or more voltage domains which correspond to particular power distribution subdivisions within the integrated circuit device. In large integrated circuit devices, operating frequency is a significant design concern, and many times an increased operating frequency is desired. However, a major barrier to increasing integrated circuit operating frequency is transient response and stability of the voltage domains supplying various processing units that form the integrated circuit device. These processing units, among other on-die components, can have power demands that vary rapidly and across a large power consumption range. As these power demands change quickly over time, voltage levels can experience dips or spikes, potentially leading to operational failures of at least the processing units.

Decoupling capacitors can be employed to reduce some transient effects related to these power demands Unfortunately, placement of decoupling capacitors on nearby circuit boards can lead to other sets of problems, and is limited in effectiveness because such placement is relatively far away in electrical terms to target circuitry. For example, inductance from interconnect and positioning between the decoupling capacitors and the target circuitry limits the effectiveness of the decoupling capacitors. Moreover, these decoupling capacitors take up valuable circuit real estate, complicate circuit placement and routing, and can unintentionally space apart processing units or other functional elements leading to less than ideal performance.

OVERVIEW

Power control and decoupling capacitance arrangements for integrated circuit devices are discussed herein. In one example, an assembly includes a first circuit assembly comprising a first circuit board coupled to an integrated circuit device, wherein the first circuit board is coupled to first surface of a system circuit board. The assembly also includes a second circuit assembly comprising a second circuit board having one or more voltage adjustment units configured to supply at least one input voltage to the integrated circuit device, wherein the second circuit board is coupled to a second surface of the system circuit board and positioned at least partially under a footprint of the integrated circuit device with respect to the system circuit board.

In another example, an apparatus includes a motherboard, and a carrier circuit board for an integrated circuit device coupled to a first surface of the motherboard. The apparatus also includes a circuit assembly comprising a circuit board having decoupling capacitance for the integrated circuit device and one or more voltage adjustment units configured to supply at least one input voltage to the integrated circuit device, wherein the circuit assembly is positioned at least partially opposite to the carrier circuit board on a second surface of the motherboard.

In another example, a circuit arrangement includes a motherboard, a system on a chip (SoC) device coupled to a first surface of the motherboard, and a circuit board assembly comprising decoupling capacitance for the SoC device and one or more voltage adjustment units configured to supply at least one input voltage to the SoC device, wherein the circuit assembly is positioned at least partially opposite to the SoC device on a second surface of the motherboard.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1:
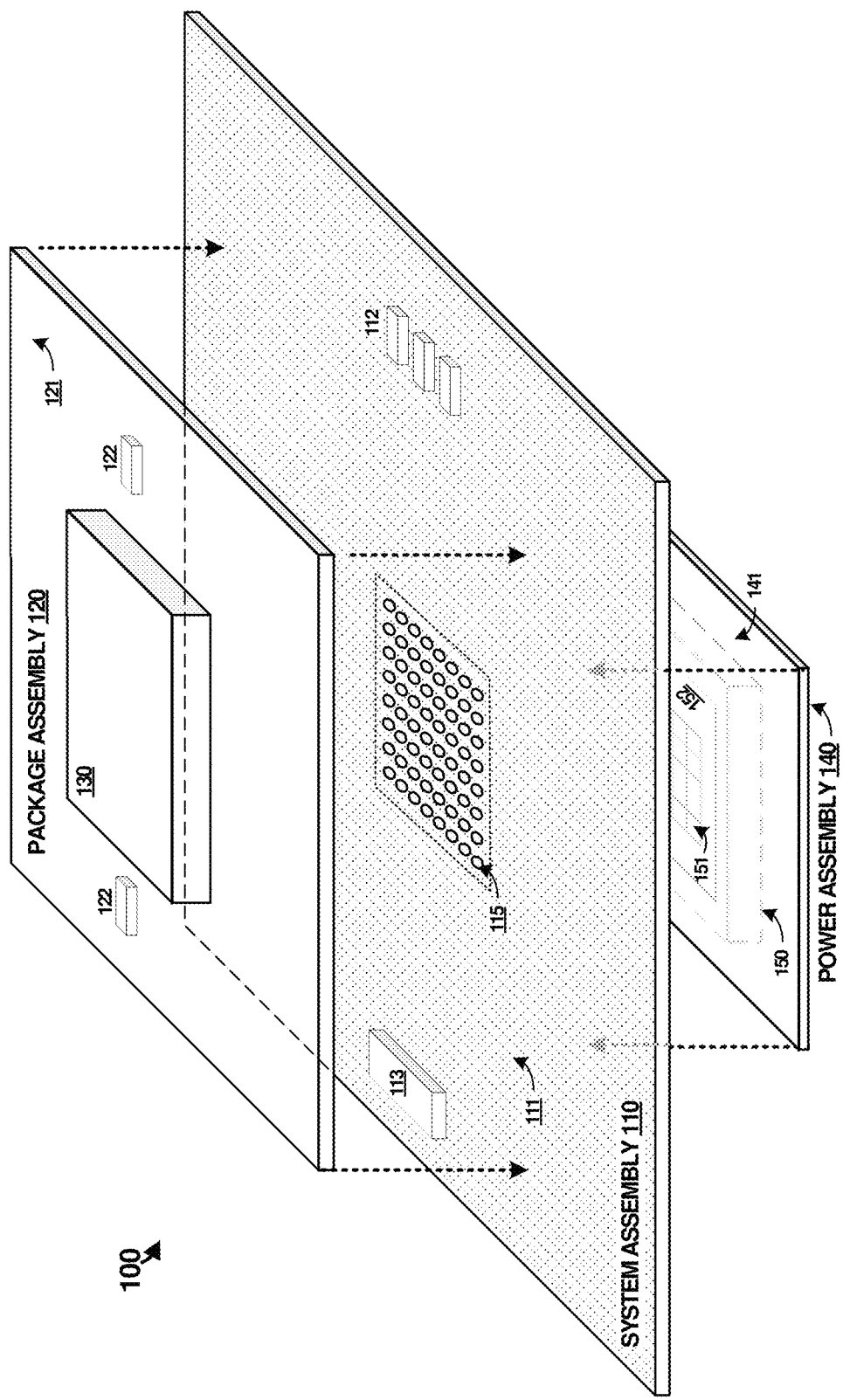
FIG. 1 illustrates an integrated circuit assembly in an implementation.

In integrated circuit devices, such as system-on-a-chip (SoC) and processor designs, operating frequency can be a significant operating parameter. A major roadblock to increasing processor frequency is the transient response and stability of the voltage rails supplying execution units of the processor. Thus, an effective strategy is desired to decrease the influence of high frequency voltage transient events, such as dips or droops, among other transient events. Decoupling capacitors are employed in many integrated circuit designs to attempt to reduce the effect of voltage transient events. A simple tool to evaluate the effectiveness of a decoupling capacitor can be measuring a path that electrical current takes when traveling to a capacitor and back. The area inside this path or loop translates to inductance, and this inductance limits the frequencies over which the capacitor can be effective for decoupling purposes.

Decoupling capacitors can be positioned on a main circuit board outside of a perimeter of an SoC. However, this positioning can still leave relatively long distances between the decoupling capacitors and the target circuitry, which can have associated inductance and further exasperate the negative influences of transient events. Main board perimeter decoupling capacitors are typically too far away from an affected circuit and have too much inductance to relieve very fast transients on SoC devices. Some decoupling capacitors are placed in a land-side configuration on a die carrier, referred to as land-side capacitors (LSCs). These land-side capacitors are placed on a circuit board package that carries the die, but underneath/opposite the integrated circuit die shadow or footprint. In recent SoC and processor designs, these land-side capacitors have fallen out of popularity, as using them prevents a package designer from placing solder pads/balls for the die in the area directly underneath the die, and makes routing circuit board traces more complex. This increases a size of the die carrier (costing more) and also compromises power delivery of a main board voltage regulator system. Thus, die-side carrier perimeter decoupling capacitors have been employed instead, referred to as die-side capacitors (DSCs). These are decoupling capacitors placed on a top side of the die carrier, outside of a perimeter adjacent to the semiconductor die. An examination of the associated current loops indicate that these DSCs are less effective than LSCs because the associated capacitor distance is much greater from the die. For this reason, DSCs struggle to contribute effectively to voltage droop mitigation.

Another solution is to integrate capacitance into the same die as the integrated device itself. Since capacitance is directly related to unit area, any addition of capacitive structures on the die results in more die area. Thus, this technique is typically an expensive venture leading to larger dies and increasing costs. Also, on-die decoupling capacitors take up valuable circuit real estate, complicate fabrication, and can unintentionally space apart processing units or other functional elements leading to logic routing and placement complications. High-performance processors are often built using the latest fabrication technology and smallest feature sizes, and thus are the most expensive to manufacture, so any increase in die area for capacitance also increases the total integrated circuit cost dramatically. Adding capacitance structures to make the die larger also can create challenges for semiconductor designers, since capacitance structures can displace functional logic or processing cores, and affected signals must travel farther. This can lead to difficultly in placement and routing, as well as establishing proper timing relationships among logic/cores.

In the examples herein, several example implementations of enhanced decoupling capacitance arrangements and arrangements are discussed. These capacitance arrangements comprise a plurality of capacitors placed underneath an integrated circuit device which is coupled to a carrier or package. For example, a chip-scale integrated circuit device, such as a flip-chip device, might be coupled to a first side of a carrier circuit board to provide for pinout and power to the integrated circuit device. A second side of the carrier typically has a pinout or ball grid arrangement for coupling the carrier to a motherboard or other similar circuit assembly. Together, the integrated circuit device and carrier circuit board can form a package assembly.

As discussed herein, decoupling capacitance is positioned below a footprint of the integrated circuit device. However, instead of placing capacitors onto a motherboard or system board which is mounted to the integrated circuit device or carrier of the integrated circuit device, a sub-assembly is provided. This sub-assembly comprises a circuit board and decoupling capacitance which is mounted to underneath the motherboard or system circuit board. Typically, this sub-assembly is mounted below the integrated circuit device, such as on an opposite surface or side of the system circuit board. Advantageously, decoupling capacitance can be placed very near the integrated circuit device, significantly closer than perimeter decoupling capacitance. Moreover, the sub-assembly can be mounted to the motherboard or system circuit board in a more favorable configuration than mounting discrete capacitors directly to the underside of the system circuit board. As mentioned above, intervening traces, vias, and other circuit board features might complicate mounting of decoupling capacitance to a system circuit board below an integrated circuit device. Many integrated circuit devices can have dense pinouts or ballouts which require dense routing of circuit traces with associated circuit vias. This dense circuit arrangement can prevent surface mounting of capacitance elements without disruptive re-routing of underlying circuit traces or adding many more layers into a circuit board stackup with associated vias—whether through-hole vias or embedded/hidden vias.

Thus, the arrangements and assemblies presented herein provide for several enhanced implementations of adding decoupling capacitors for integrated circuit devices. These decoupling capacitors are placed very near to portions of the integrated circuit device which consume power and may experience transient operation or dynamic power consumption. In this manner, voltage dips and droops can be greatly reduced for the integrated circuit device without adding unwanted inductance from decoupling capacitors which might be placed outside a perimeter of the integrated circuit device or outside perimeters of associated packaging or carrier assemblies.

In addition to decoupling capacitance, the sub-assembly discussed above might also provide voltage adjustment features for the integrated circuit device. These voltage adjustment features can include reducing voltage levels supplied to the integrated circuit device. Performance tests can be performed on the integrated circuit device which establish minimum operating voltages for one or more voltage domains of the integrated circuit device. Once these minimum voltages have been discovered, then the sub-assembly can have voltage adjustment circuitry thereon which alters voltage levels provided to the integrated circuit device. By locating voltage adjustment circuitry very near to the integrated circuit device along with decoupling capacitance, better determinations of the voltage minimums can be determined. Moreover, placing decoupling capacitance on the same sub-assembly as the voltage adjustment circuitry can reduce the needed voltages further by producing a more stable input voltage and reducing voltage transients experienced by the integrated circuit device which can allow for tighter tolerances on provided voltages.

Turning now to a first example implementation, FIG. 1 is presented. FIG. 1 illustrates an integrated circuit arrangement 100 in an implementation. In FIG. 1, system circuit board 111 of system assembly 110 is conductively coupled to package assembly 120. Package assembly comprises carrier circuit board 121 for integrated circuit device 130. FIG. 1 also shows power assembly 140 comprising power assembly circuit board 141 and power circuitry 150. Power assembly 140 is mated to system circuit board 111 "underneath" a shadow or footprint of at least a portion of integrated circuit device 130. The terms underneath or below refer to a side of carrier circuit board 121 opposite the side onto which integrated circuit device 130 is mounted or coupled.

In typical configurations, integrated circuit device 130 comprises various processing cores, interfacing logic, power distribution structures, and the like. Integrated circuit device 130 is bonded or otherwise coupled to carrier circuit board 121 of package assembly 120. Together, package assembly with integrated circuit device 130 might comprise a system-on-a-chip (SoC), central processing unit (CPU), or graphics processing unit (GPU), among other integrated devices. This integrated device can be coupled to a system board, such as a motherboard, comprising system circuit board 111 for integration into a computing system. Various support circuitry (not shown for clarity), such as memory, storage, peripherals, power supplies, and other related circuitry, can be included on such a system board, also referred to as a motherboard. System assembly 110 can comprise this system board, as well as other components.

System circuit board 111 includes conductive pads 115 which comprise at least a portion of the conductive pads used to conductively couple package assembly 120 to system circuit board 111. One or more of these conductive pads is configured to carry input power to package assembly 120 and integrated circuit device 130. This input power can be one or more input voltages or supply voltages provided to integrated circuit device 130 over associated external connections on integrated circuit device 130. Carrier circuit board 121 couples to these external connections and provides further coupling of these input voltages to system circuit board 111 via associated conductive pads 115.

In operation, dynamic power demands and electromagnetic interference concerns might warrant one or more decoupling capacitors. As will be discussed in more detail in FIG. 2, power circuitry 150 can comprise decoupling capacitance which is positioned below these conductive pads and conductively coupled through system circuit board 111 to these conductive pads. Thus, very short connection distances and minimal routing is needed between decoupling capacitance and on-chip power features and domains of integrated circuit device 130.

Various perimeter decoupling capacitors can also be placed onto system assembly 110 and package assembly 120, such as around perimeters of integrated circuit device 130 and package assembly 120. In FIG. 1, a first set of decoupling capacitors 112 are positioned onto system circuit board 111. A second set of decoupling capacitors 122 are positioned onto package assembly 120. Decoupling capacitors 112 and 122 can reduce voltage fluctuations due to transient effects of integrated circuit device 130, as well as reduce susceptibility and emissions with regard to electromagnetic interference. However, due to the distances between decoupling capacitors 112 and 122 and relevant portions of integrated circuit device 130, relatively large current loops can be formed, which has corresponding inductance on the affected voltage links of included power domains. These inductances, among other factors, can limit the transient speeds or maximum frequencies over which decoupling features are effective. When these decoupling features are not sufficient to reduce transients on voltage links, such as droops, dips, and spikes, among other transient events, then operation of integrated circuit device 130 can be reduced. Failures can even result during larger transient events and dynamic changes in power demands of integrated circuit device 130.

One potential way to compensate for voltage dips and droops is to increase a level of a voltage supplied the various power domains of integrated circuit device 130. For example, if a particular voltage domain specifies 1.00 VDC, then an increase to 1.05 VDC or 1.10 VDC might aid tolerance of integrated circuit device 130 to various voltage dips. However, this not only can waste energy, but lead to higher power dissipation within integrated circuit device 130, and thus increased heating. In FIG. 1, instead of increasing a supply voltage level, or altering a quantity or arrangement of capacitors around a perimeter of integrated circuit device 130 or package assembly 120, an enhanced arrangement is shown.

Specifically, FIG. 1 power circuitry 150 which includes decoupling capacitance 151 and is positioned onto an opposite side of system circuit board 111 than integrated circuit device 130. Decoupling capacitance 151 is placed underneath a shadow or footprint of integrated circuit device 130, providing for a very close physical location between decoupling capacitance 151 and associated portions of integrated circuit device 130. Decoupling capacitance 151 can be individually connected to power distribution features of integrated circuit device 130. Decoupling capacitance 151 can be conductively connected to integrated circuit device 130 through system circuit board 111. In this manner, decoupling capacitance 151 can be positioned very near power features of integrated circuit device 130 to significantly decrease any distance between capacitance structures and affected power features. Inductive loop distance/area can also be correspondingly reduced between decoupling capacitance 151 and power features of integrated circuit device 130, leading to faster transient response for voltage domains. Thus, an actual supplied voltage level experiences much smaller deviations from a desired voltage level or circuit minimum voltage levels. Such assemblies formed with decoupling capacitance 151 and integrated circuit device 130 can improve a minimum voltage (Vmin) needed to supply a particular integrated circuit by 50-100 mV or more which translates into a 10-20% improvements in device power efficiency. If desired, these efficiency gains in Vmin operation can be translated into supplying a lower voltage level to the affected circuit, which can reduce power dissipation for a particular operating frequency. In addition, an increased operating frequency can alternatively be supported with these improvements to the voltage levels being supplied to integrated circuit device 130. In some examples, the voltage reduction resultant from a new Vmin can be used entirely for power savings without performance improvement for processing cores of integrated circuit device 130. Alternatively, some (or all) of the Vmin improvement can instead be used for performance improvement with increased operating frequencies for processing cores. Combinations of voltage reductions for power savings and increases in performance by operating frequency increases are also possible.

Figure 2:
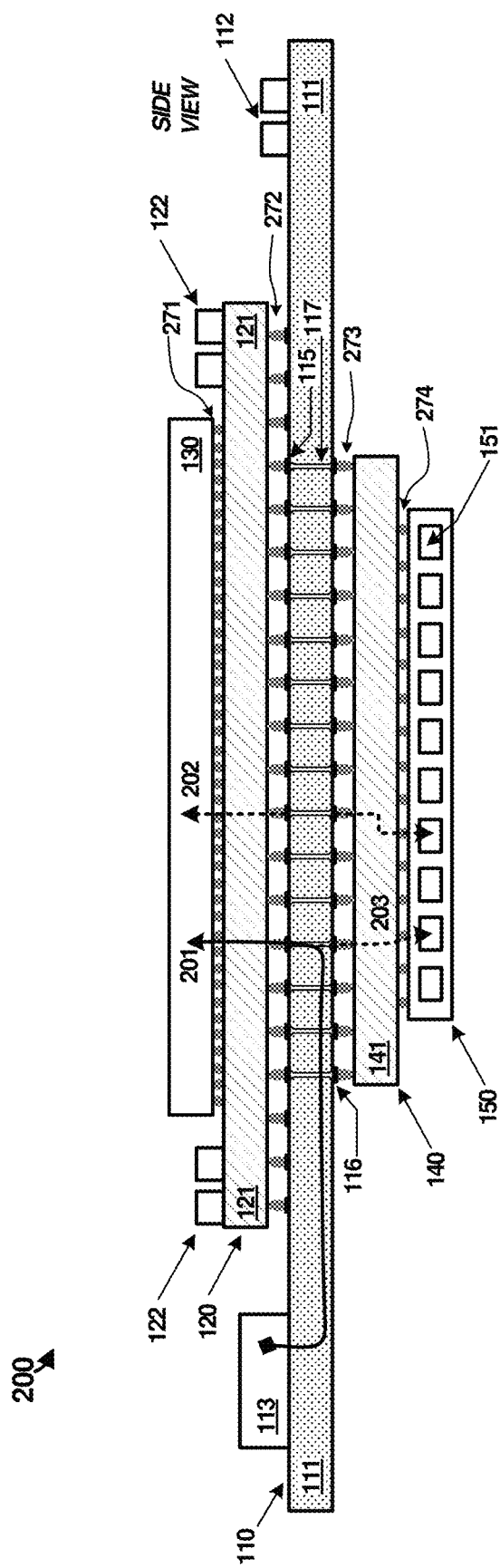
FIG. 2 illustrates a side view of an integrated circuit assembly in an implementation.
Figure 3:
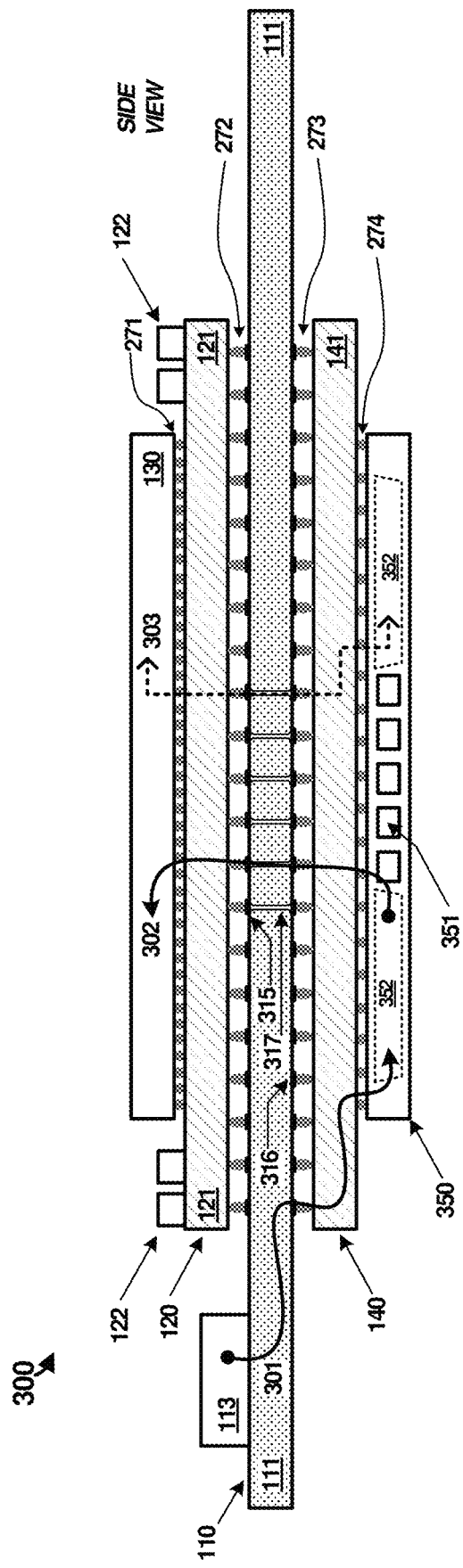
FIG. 3 illustrates a side view of an integrated circuit assembly in an implementation.

To further take advantage of gains in Vmin operation, power adjustment circuitry can be placed onto power assembly 140 and within power circuitry 150. The example shown in FIG. 2 illustrates a decoupling capacitance-only version of power circuitry 150 that includes decoupling capacitance 151. The example shown in FIG. 3 illustrates power circuitry 350 which includes voltage adjustment circuitry 352 along with decoupling capacitance 351, and will be discussed further below.

Decoupling capacitance 151 can comprise various forms. In a first example, decoupling capacitance 151 comprises discrete capacitors as a part of an enhanced surface mount capacitor arrangement. Discrete capacitors can be coupled mechanically and electrically to circuit board 141 of power assembly 140, such as terminals and conductive pads coupled using solder. These discrete capacitors can be bonded using reflow soldering or similar techniques to conductively couple individual capacitors to conductive pads of circuit board 141.

In a second example, an integrated capacitance device might be employed instead of discrete capacitors for decoupling capacitance 151. An integrated capacitance device can comprise a plurality of individual capacitors formed by semiconductor-based capacitance structures. This integrated capacitance device can comprise a semiconductor wafer-fabricated integrated circuit. An integrated capacitance device can include a semiconductor capacitor array comprising an integrated array of silicon-based, metal-oxide-semiconductor, or metal-insulator-semiconductor capacitance elements. Other semiconductor structures can be included, such as voltage adjustment circuitry formed from transistors, interconnect, and various active and passive circuitry. Various interconnect might be included in an integrated capacitance device to form zones, groups, or other customized configurations among capacitance structures. Additionally, interconnect is employed to couple terminals of various capacitance structures and grouped capacitance structures to external interconnection features, such as conductive pads or external interfacing elements. An integrated capacitance device can be a thinned device where a back or bottom substrate portion is shaved or etched thinner to reduce a thickness for enhanced thermal dissipation or reduction in stackup height.

Turning now to a detailed discussion on the elements of FIG. 1, system assembly 110 comprises one or more printed circuit boards (PCBs) or circuit card assemblies (CCAs) formed using various circuit board manufacturing processes. System assembly 110 can comprise a computing system motherboard or daughterboard in many examples. System assembly 110 can include circuit boards as well as components mounted to the circuit boards. In FIG. 1, system assembly 110 includes exemplary system circuit board 111, although other configurations are possible. System circuit board 111 can comprise fiber-infused dielectric materials, such as fiberglass, FR4, or various composite materials. System circuit board 111 comprises two surfaces or sides as well as several layers of alternating insulating board material and conductive interconnect or traces formed with metal etchings or printed conductive features. System circuit board 111 can include one or more power distribution layers/planes or grounding layers/planes which form one or more layers of the associated circuit board. System circuit board 111 can include conductive vias which can penetrate an entire layered stackup of system circuit board 111 or a subset of layers, which may or may not include hidden or buried vias. System circuit board 111 can include labeling/screen printing, solder mask material, and chassis mounting features.

Decoupling capacitors 112 can be included on system circuit board 111 within system assembly 110. Capacitors 112 can comprise surface mount, multilayer ceramic capacitors (MLCCs), through-hole, or other types of discrete capacitors. Similarly, capacitors 122 can comprise similar types of capacitors as capacitors 112. Capacitors 112 and 122 can be of various sizes, such as 0201, 0402, or 0603 size surface mount capacitors, among others.

Power supply circuitry 113 comprises various power conditioning, filtering, and handling components which accept input power for a system comprising elements in FIG. 1. In one example, power supply circuitry 113 comprises a plurality of power phases each comprising voltage conversion circuitry to step down or step up source power to various supply voltages or input voltages provided to integrated circuit device 130, among other components on system assembly 110. These power phases can each have an associated controlled voltage level, which might be variable or adjustable depending upon conditions, performance testing, minimum necessary voltages, or other factors. The power phases can provide power to integrated circuit device 130 over dedicated circuit links comprising circuit traces, circuit board vias, and power planes which route the power from circuitry represented by power supply circuitry 113 over system circuit board 111 and other elements including power assembly 140 and package assembly 120. Individual decoupling capacitors or groups of decoupling capacitors can be connected to these dedicated circuit links, as shown in FIG. 1 for capacitors 151.

Power assembly 140 and power circuitry 150 include portions of power supply circuitry 113, or additional circuitry to complement power supply circuitry 113. For example, additional step-down regulation circuitry may be included in power circuitry 150 to regulate the voltage levels provided to the integrated circuit device. Voltage adjustment circuitry 352 of FIG. 3 can be one example implementation of this step-down regulation circuitry. In this configuration, input power for one or more power domains of integrated circuit device 130 might be routed first through power assembly 140 and power circuitry 150 before being routed to package assembly 120 and integrated circuit device 130. In other examples, instead of routing the input power for one or more power domains of integrated circuit device 130 first through power assembly 140 and power circuitry 150, this input power can be routed directly to integrated circuit device 130. Control over voltage levels of the input power by power circuitry 150 can be achieved using on-chip or on-die power control features of integrated circuit device 130 or by communication with power supply circuitry 113 to indicate preferred voltage levels to be supplied to integrated circuit device 130 by power supply circuitry 113.

Package assembly 120 comprises an integrated circuit package which includes a carrier comprising a printed circuit board, typically smaller than that of system assembly 110. Package assembly 120 can comprise similar materials as system assembly 110, such as layers of insulating and conductive materials with associated traces, planes, routing, vias, and the like. Package assembly 120 couples to system assembly 110 via one or more solder bumps or solder features, such as controlled collapse chip connections (C4). Typically, pins and sockets are not employed for package assembly 120, but in some examples are possible. Package assembly 120 can comprise a flip-chip assembly when fitted with an associated die of an integrated circuit, such as integrated circuit device 130. Package assembly 120 has a first surface or side (referred to as a die side) which couples to integrated circuit device 130 and a second surface or side (referred to as a land side) which couples to a system assembly PCB via solder features, such as conductive pads and solder balls.

Integrated circuit device 130 comprises a microprocessor, central processing unit (CPU), graphics processing unit (GPU), system-on-a-chip (SoC), application-specific integrated circuit (ASIC), field-programmable gate array (FPGA) tensor processing unit (TPU), or baseband processing unit (BBU), among other analog and digital integrated circuits. Integrated circuit device 130 is formed using various semiconductor manufacturing processes, such as employed in semiconductor wafer fabrication. Integrated circuit device 130 can comprise silicon-based circuit, but might also include other types of semiconductor materials as well as associated conductive interconnect. Integrated circuit device 130 includes various layers, logic devices, interconnect, metallization, processing cores, and interfacing circuitry. Integrated circuit device 130 comprises one or more power domains, each having a characteristic voltage level. Integrated circuit device 130 can comprise a flip-chip design which has external pads on a top side of chip (with regard to a manufacturing directionality), and is coupled to carrier circuit board 121 of package assembly 120 via solder features/balls, controlled collapse chip connections (C4) or other conductive bonding processes.

Power assembly 140 comprises power circuitry 150 with decoupling capacitance 151. Power assembly 140 might comprise an integrated circuit package which includes a carrier comprising a printed circuit board 141, typically smaller than that of system assembly 110. Power assembly 140 can comprise similar materials as system assembly 110, such as layers of insulating and conductive materials with associated traces, planes, routing, vias, and the like. Power assembly 140 couples to system assembly 110 via one or more solder bumps or solder features, which might include C4 connections. Typically, pins and sockets are not employed for power assembly 140, but in some examples are possible. Power assembly 140 can comprise a flip-chip assembly when fitted with an associated die of an integrated circuit comprising power circuitry 150 or decoupling capacitance 151. Power assembly 140 has a first surface or side (referred to as a die side) which couples to power circuitry 150 or decoupling capacitance 151 and a second surface or side (referred to as a land side) which couples to a system assembly PCB via solder features, such as conductive pads and solder balls. Power assembly 140 might be pre-assembled before coupling to system assembly 110. Power assembly 140 can couple communication signals and power between system circuit board 111 and power circuitry 150 through associated connections comprising vias, circuit traces, power planes, and the like. In some examples, the ball arrangement on power assembly 140 matches that provided by carrier circuit board 121, and thus can couple to system circuit board 111 in a similar connection arrangement, conductive pad arrangement, or pinout/ballout to that of package assembly 120.

Capacitors 151 can comprise surface mount, multilayer ceramic capacitors (MLCCs), or other types of discrete capacitors or various materials, including semiconductor capacitors. Capacitors 151 can be of various sizes, such as 0201 or 0204 sizes, or of larger sizes such as 0603 or 0402 size surface mount capacitors, among others. In an alternative example, instead of discrete or individual capacitors, capacitors 151 might comprise an integrated capacitance element having an array of individual capacitors integrated into a silicon or semiconductor die. This semiconductor capacitor array might comprise an integrated array of metal-oxide-semiconductor or metal-insulator-semiconductor capacitance elements which have associated zones or groups to couple individual capacitance elements into larger sets for coupling to external circuitry. Conductive pads and associated metallized interconnect can be integrated into the semiconductor capacitor array for coupling the capacitance elements to external circuitry, such as via C4 connections to conductive pads of circuit board 141.

FIG. 2 illustrates side view 200 of an integrated circuit assembly in an implementation. Although similar elements as found in FIG. 1 are shown in FIG. 2, it should be understood that other elements can instead be included. Also, many elements in FIG. 2 are not drawn to scale, and instead are sized to enhance clarity in the associated discussion.

Side view 200 illustrates a stackup among system assembly 110, package assembly 120, integrated circuit device 130, power assembly 140, and power circuitry 150. System assembly 110 is shown having system circuit board 111 with one or more perimeter decoupling capacitors 112 and power supply circuitry 113. Further circuitry can be included in system assembly 110, such as memory, storage, peripherals, power distribution circuitry, and other similar elements. These are not shown in FIG. 2 for clarity.

Integrated circuit device 130 comprises a semiconductor die which is bonded to carrier circuit board 121 of package assembly 120. This configuration might comprise a flip-chip configuration, although other configurations are possible. Solder balls 271 couple integrated circuit device 130 to carrier circuit board 121 to form package assembly 120, along with other circuitry which might include perimeter decoupling capacitors 122. Package assembly 120 is also coupled using solder balls 272 to system circuit board 111.

Power circuitry 150 comprises either an integrated capacitor device or discrete capacitors which are coupled to circuit board 141. When power circuitry 150 comprises an integrated capacitor device, then power circuitry 150 comprises a semiconductor die which is bonded to circuit board 141 via solder balls 274. When power circuitry 150 comprises discrete capacitors, then these discrete capacitors are coupled to circuit board 141 via associated terminals, conductive pads, and solder features. Power assembly 140 is coupled using solder balls 273 to system circuit board 111.

System circuit board 111 also includes conductive pads 115 to couple to solder balls 272, and conductive pads 116 to couple to solder balls 273. In this example, several vias 117 are included which span from selected ones of conductive pads 115 to conductive pads 116. This configuration conductively couples the selected conductive pads to create common electrical nodes close to integrated circuit device 130. Typically, these selected conductive pads are used to supply one or more input voltages or reference voltages/grounds to integrated circuit device 130 from system circuit board 111. Other ones of the conductive pads 115 might couple communication lines or other types of links. Vias 117 each comprise electrical connections between layer of system circuit board 111. In this example, vias 117 fully span through the vertical thickness of system circuit board 111. Other examples might have buried, hidden, or blind vias for at least a portion of vias 117. Vias 117 might comprise through-hole vias, micro-vias, thermal vias, or other types of vias, including combinations thereof.

Placement of decoupling capacitance 151 on circuit board 141 can correspond to various areas of integrated circuit device 130 that can benefit from decoupling capacitance, due in part to having dynamic operation with high power demand and susceptibility to voltage transients. Example areas of integrated circuit device 130 include processing cores, graphics cores, input/output cores, memory bus cores, and other similar elements. Some areas of the device may be somewhat immune from such concerns, due to either low power demands overall or having consistent power demand that varies little and thus corresponds to low power supply noise. Using one or more of vias 117, decoupling capacitance 151 can be closely coupled electrically to input connections of integrated circuit device 130, and thus provide enhanced decoupling features.

Moreover, vias 117, conductive pads 115, and conductive pads 116 can have any arbitrary arrangement along with any associated circuit traces and routing on the surfaces of system circuit board 111 and within internal layers of system circuit board 111. Power assembly 140 can couple to this arbitrary arrangement of vias 117 and conductive pads 116, while still providing a desired arrangement and placement of decoupling capacitance 151 with regard to power input features of integrated circuit device 130. As seen by power coupling 202, even if a particular conductive pad and via arrangement does not allow for placement of decoupling capacitance directly onto system circuit board 111, the usage of power assembly 140 with circuit board 141 can overcome these limitations. Specifically, decoupling capacitance 151 can be positioned arbitrarily with regard to underlying vias and conductive pads of system circuit board 111 to optimize placement of decoupling capacitance 151 with regard to structures within integrated circuit device 130. Minimization of electrical link distances can be achieved using this arrangement of circuit board 141 and decoupling capacitance 151.

Various potting, such as epoxy, filler, thermal compound, or other material can be deposited between integrated circuit device 130 and carrier circuit board 121, and between carrier circuit board 121 and system circuit board 111. Likewise, various potting can be deposited between power circuitry 150 and circuit board 141, and between circuit board 141 and system circuit board 111. Potting can aid in mechanical holding and stability of components. Potting can also aid solder reflow operations when mating chip-scale assemblies 120 and 140 to system circuit board 111, such as to prevent movement or de-soldering of integrated circuit device 130 from solder balls 271 and power circuitry from solder balls 274. Other techniques can be employed, such as using solder materials with different melting points for different sets of solder balls.

Advantageously, the stackup formed in FIG. 2 provides for decoupling capacitance 151 to be placed near to affected circuitry of integrated circuit device 130. Decoupling capacitors 151 thus become more effective at reducing high-frequency transients in power lines and power domains of integrated circuit device 130. Moreover, since correspondingly short links are needed between decoupling capacitance 151 and internal features of integrated circuit device 130, such as compared to perimeter capacitors 112 and 122, inductance between decoupling capacitance 151 and integrated circuit device 130 is also minimized Power assembly circuit board 141 provides for arbitrary arrangement of decoupling capacitance 151 with regard to conductive pads, circuit traces, and vias of system circuit board 111.

A final assembly having package assembly 120 positioned opposite to that of power assembly 140 on system circuit board 111 would provide substantially improved power supply decoupling for integrated circuit device 130 that allows for improved performance and/or reduced power supply voltages due to decreased power supply noise. This can also lead to improved circuit operating voltage minimum (Vmin) values by having less dynamic variation in voltage levels provided to the individual power domains. The closely-positioned decoupling capacitance can lead to better dynamic performance on any associated voltage lines and voltage domains of integrated circuit device 130, allowing for lower operating voltages for the domains of integrated circuit device 130, and hence lower power. Voltage optimization techniques might be controlled by control elements external to power circuitry 150, to determine reduced input voltages to provide to integrated circuit device 130. These voltage optimization techniques can also benefit from the closely-positioned decoupling capacitances shown herein. Specifically, a reduced magnitude of transient effects on voltage domains from the close decoupling capacitance can also correspond to reduced voltage levels needed to be supplied to a given circuit.

To illustrate power flow through a final assembly having package assembly 120 positioned opposite to that of power assembly 140 on system circuit board 111, example power flow 201 is shown. Power flow 201 can be for any exemplary power link, voltage domain, ground, or reference voltage provided to integrated circuit device 130. Input power/voltage is received from an external power source, conditioned and converted by power supply circuitry 113 and provided to circuit board traces/planes of system circuit board 111. For example, $V_{DD}$ and ground for integrated circuit device 130 can be represented by power flow 201 and routed through one or more solder balls 271-272 in FIG. 2 to reach integrated circuit device 130. Power flow 201 as shown in FIG. 2 might represent more than one instance of $V_{DD}$ and ground for individual power domains of integrated circuit device 130. In this example, power flow 201 does not pass through power assembly 140 before being directed to carrier circuit board 121. Instead, capacitance elements among decoupling capacitance 151 tap into power traces, planes, or vias 117 of system circuit board 111. In addition to the flow of power from power supply circuitry 113 to integrated circuit device 130, decoupling capacitance 151 can be conductively coupled as shown for branch 203 to allow for near-die decoupling of power flow 201 before reaching integrated circuit device 130.

FIG. 3 illustrates side view 300 comprising an alternative arrangement of elements of FIGS. 1 and 2. FIG. 3 illustrates additional voltage adjustment circuitry 352 included in power circuitry 350 as a further example implementation of power circuitry 150 of FIG. 1, as well as a serial power configuration where power first flows through voltage adjustment circuitry 352 before being directed to integrated circuitry device 130. Although similar elements as found in FIGS. 1 and 2 are shown in FIG. 3, it should be understood that different elements can instead be included. Also, many elements in FIG. 3 are not drawn to scale, and instead are sized to enhance clarity in the associated discussion.

Side view 300 illustrates a stackup among system assembly 110, package assembly 120, integrated circuit device 130, power assembly 140, and power circuitry 350. System assembly 110 is shown having system circuit board 111 with power supply circuitry 113. Further circuitry can be included in system assembly 110, such as memory, storage, peripherals, power distribution circuitry, and other similar elements. These are not shown in FIG. 3 for clarity.

Integrated circuit device 130 comprises a semiconductor die which is bonded to carrier circuit board 121 of package assembly 120. This configuration might comprise a flip-chip configuration, although other configurations are possible. Solder balls 271 couple integrated circuit device 130 to carrier circuit board 121 to form package assembly 120, along with other circuitry which might include perimeter decoupling capacitors 122. Package assembly 120 is also coupled using solder balls 272 to system circuit board 111.

Power circuitry 350 is included as a further example of power circuitry 150 in FIGS. 1 and 2, although variations are possible. Moreover, power circuitry 350 includes voltage adjustment circuitry 352 in addition to decoupling capacitance represented by elements 351. Power circuitry 350 comprises an integrated circuit device having semiconductor capacitance elements 351 and voltage adjustment circuitry 352. Power circuitry 350 comprises a semiconductor die which is bonded to circuit board 141 via solder balls 274. Power assembly 140 is coupled using solder balls 273 to system circuit board 111.

System circuit board 111 also includes conductive pads 315 to couple to solder balls 272, and conductive pads 316 to couple to solder balls 273. In this example, several vias 317 are included which span from selected ones of conductive pads 315 to conductive pads 316. Vias 317 are employed in this example to provide power to integrated circuit device 130. This power can comprise one or more input voltages for one or more voltage domains of integrated circuit device 130. Also, one or more reference voltages or grounds might also be provided over selected vias 317. A shared or common ground might be employed, or various independent grounds might instead be employed. Ones of the conductive pads 315 might couple communication lines or other types of links. Vias 317 each comprise electrical connections between layer of system circuit board 111. In this example, vias 317 fully span through the vertical thickness of system circuit board 111. Other examples might have buried, hidden, or blind vias for at least a portion of vias 317. Vias 317 might comprise through-hole vias, micro-vias, thermal vias, or other types of vias, including combinations thereof.

In this example, power circuitry 350 receives power comprising one or more supply voltages from power supply circuitry 113 over system circuit board 111, selected conductive pads 316, and selected solder balls 273. Power circuitry 350 can receive these one or more supply voltages and provide one or more input voltages to integrated circuit device 130 over selected vias 317. These one or more input voltages might comprise the one or more supply voltages or may instead be a modified version of the one or more supply voltages. For example, power circuitry 350 can include voltage adjustment circuitry 352 which comprises circuitry to alter or adjust voltage levels of the one or more supply voltages to produce the one or more input voltages. This circuitry can include voltage regulation circuitry, active and passive circuit elements, voltage step-down circuitry, voltage step-up circuitry, switching regulator circuitry, linear regulator circuitry, DC-DC conversion circuitry, and other various voltage modification circuitry.

Voltage adjustment circuitry 352 can also include control elements, such as one or more processing elements, software, firmware, programmable logic, or discrete logic which can receive instructions to perform one or more voltage adjustment processes discussed herein. This example shows voltage adjustment circuitry 352 potentially altering or modifying supply voltages to produce input voltages for integrated circuit device 130. Voltage adjustment circuitry 352 can have one or more external communication links 303 which communicatively couple voltage adjustment circuitry 352 to power supply circuitry 113 or integrated circuit device 130. Communication links 303 might comprise serial or parallel communication links, such as system management bus (SMB) interfaces, inter-integrated circuit (I2C) interfaces, or proprietary communication links transported over one or more active signal lines. Communication links 303 can indicate preferred or selected voltage levels to be provided by voltage adjustment circuitry 352 to integrated circuit device 130. Integrated circuit device 130 or other elements external to voltage adjustment circuitry 352 can include control elements to perform voltage optimization or voltage minimization processes. Some examples might have voltage adjustment circuitry 352 include control elements to perform the voltage optimization or voltage minimization processes. Also, other examples, might have additional voltage modification circuitry external to voltage adjustment circuitry 352, power supply circuitry 113, and integrated circuit device 130, which might be mounted to power assembly circuit board 141, carrier circuit board 121, or system circuit board 111.

Power circuitry 350 also includes decoupling capacitance 351. Decoupling capacitance 351 is located within power circuitry 350 and near to integrated circuit device 130 on an opposite side of system circuit board 111. In this example, decoupling capacitance 351 is located in a central area of power circuitry 350, such as in a central portion of a semiconductor die when a single semiconductor die is employed for power circuitry 350. Other examples might have discrete capacitors surface mounted to circuit board 141 with voltage adjustment circuitry 352 mounted to circuit board 141 as well. Placement of decoupling capacitance 351, whether within a semiconductor die or as discrete capacitors, can correspond to various areas of integrated circuit device 130 that can benefit from decoupling capacitance, due in part to having dynamic operation with high power demand and susceptibility to voltage transients. Example areas of integrated circuit device 130 include processing cores, graphics cores, input/output cores, memory bus cores, and other similar elements. Some areas of the device may be somewhat immune from such concerns, due to either low power demands overall or having consistent power demand that varies little and thus corresponds to low power supply noise. Using one or more of vias 317, decoupling capacitance 351 can be closely coupled electrically to input connections of integrated circuit device 130, and thus provide enhanced decoupling features. Moreover, one or more among decoupling capacitance 351 might be conductively coupled internally to power circuitry 350 to elements of voltage adjustment circuitry 352 that produce input voltages for integrated circuit device 130.

Vias 317, conductive pads 315, and conductive pads 316 can have any arbitrary arrangement along with any associated circuit traces and routing on the surfaces of system circuit board 111 and within internal layers of system circuit board 111. Power assembly 140 can couple to this arbitrary arrangement of vias 317 and conductive pads 316, while still providing a desired arrangement and placement of decoupling capacitance 351 with regard to power input features of integrated circuit device 130. As seen in FIG. 3, even if a particular conductive pad and via arrangement does not allow for placement of decoupling capacitance directly onto system circuit board 111, the usage of power assembly 140 with circuit board 141 can overcome these limitations. Specifically, decoupling capacitance 351 can be positioned arbitrarily with regard to underlying vias and conductive pads of system circuit board 111 to optimize placement of decoupling capacitance 351 with regard to structures within integrated circuit device 130. Minimization of electrical link distances can be achieved using this arrangement of circuit board 141 and decoupling capacitance 351.

Various potting, such as epoxy, filler, thermal compound, or other material can be deposited between integrated circuit device 130 and carrier circuit board 121, and between carrier circuit board 121 and system circuit board 111. Likewise, various potting can be deposited between power circuitry 350 and circuit board 141, and between circuit board 141 and system circuit board 111. Potting can aid in mechanical holding and stability of components. Potting can also aid solder reflow operations when mating chip-scale assemblies 120 and 140 to system circuit board 111, such as to prevent movement or de-soldering of integrated circuit device 130 from solder balls 271 and power circuitry 350 from solder balls 274. Other techniques can be employed, such as using solder materials with different melting points for different sets of solder balls.

Advantageously, the stackup formed in FIG. 3 provides for decoupling capacitance 351 to be placed near to affected circuitry of integrated circuit device 130. Decoupling capacitors 351 thus become more effective at reducing high-frequency transients in power lines and power domains of integrated circuit device 130. Moreover, since correspondingly short links are needed between decoupling capacitance 351 and internal features of integrated circuit device 130, such as compared to perimeter capacitors 112 and 122, inductance between decoupling capacitance 351 and integrated circuit device 130 is also minimized Power assembly circuit board 141 provides for arbitrary arrangement of decoupling capacitance 351 with regard to conductive pads, circuit traces, and vias of system circuit board 111.

A final assembly having package assembly 120 positioned opposite to that of power assembly 140 on system circuit board 111 would provide substantially improved power supply decoupling for integrated circuit device 130 that allows for improved performance and/or reduced power supply voltages due to decreased power supply noise. This can also lead to improved circuit operating voltage minimum (Vmin) values by having less dynamic variation in voltage levels provided to the individual power domains. In FIG. 3, one or more Vmin values can be determined for individual voltage domains of integrated circuit device 130. The closely-positioned decoupling capacitance can lead to better dynamic performance on any associated voltage lines and voltage domains of integrated circuit device 130, allowing for lower operating voltages for the domains of integrated circuit device 130, and hence lower power. Voltage optimization techniques discussed herein can reduce voltage levels of input voltages provided to integrated circuit device 130. These voltage optimization techniques can also benefit from the closely-positioned decoupling capacitances shown herein. Specifically, a reduced magnitude of transient effects on voltage domains from the close decoupling capacitance can also correspond to reduced voltage levels needed to be supplied to a given circuit.

To illustrate power flow through a final assembly having package assembly 120 positioned opposite to that of power assembly 140 on system circuit board 111, example power flows 301 and 302 are shown. Power flow 301 can be for any exemplary power link, voltage domain, ground, or reference voltage provided to by power supply circuitry 113. Input power/voltage is received from an external power source, conditioned and converted by power supply circuitry 113 and provided to circuit board traces/planes of system circuit board 111. For example, $V_{DD}$ and ground for integrated circuit device 130 can be represented by power flow 301 and routed through one or more solder balls 273-274 in FIG. 3 to reach integrated circuit device 130. Power flow 301 can represent more than one instance of $V_{DD}$ and ground (or other voltage levels) for individual power domains of integrated circuit device 130. In this example, power flow 301 is routed first through power assembly 140 and power circuitry 350 before being directed to carrier circuit board 121. Power circuitry 350 can then optionally modify any of the voltages provided in power flow 301 and direct these modified voltages to integrated circuit device 130 over power flow 302. Power flow 302 is routed over solder balls 274-273, conductive pads 316, vias 317, conductive pads 315, and solder balls 272 and 271 to reach integrated circuit device 130, along with any associated circuit board traces/routes/planes encountered along the route.

Figure 4:
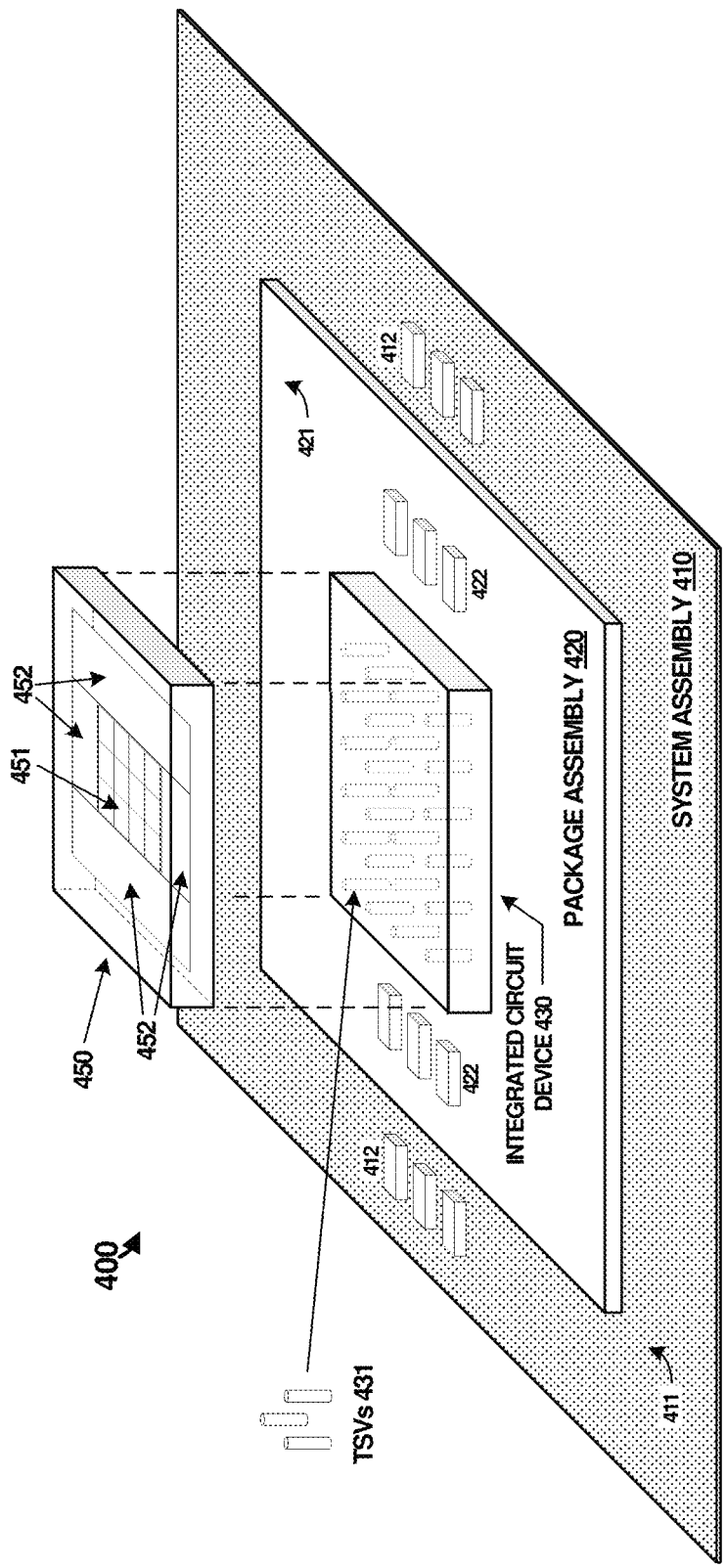
FIG. 4 illustrates an integrated circuit assembly in an implementation.

FIG. 4 is included to illustrate an alternative arrangement for power circuitry and decoupling capacitance than that shown in FIGS. 1-3. In FIGS. 1-3 power adjustment circuitry 152 or decoupling capacitance 151 are shown mounted to system circuit board 111 on an opposite side to that of integrated circuit device 130. In FIG. 4, integrated power device 450 comprising voltage adjustment circuitry 452 and decoupling capacitance 451 is shown mounted directly to integrated circuit device 430 through the use of a plurality of through silicon vias (TSVs) 431. Although similar elements are included in FIG. 4 as seen in FIG. 1-3, it should be understood that different components and arrangements can instead be employed.

FIG. 4 illustrates an integrated circuit arrangement 400 in an implementation. In FIG. 4, motherboard 411 of system assembly 410 is coupled to package assembly 420. Package assembly comprises carrier circuit board 421 for integrated circuit device 430. Integrated power device 450 comprises a semiconductor die separate from that of integrated circuit device 430, and is comprised of individual decoupling capacitance structures 451 and voltage adjustment circuitry 452. Integrated power device 450 can be placed onto integrated circuit device 430, as will be discussed below.

In typical configurations, integrated circuit device 430 comprises various processing cores, interfacing logic, power distribution structures, and the like. Integrated circuit device 430 is bonded or otherwise coupled to carrier circuit board 421 of package assembly 420. Together, package assembly with integrated circuit device 430 might comprise a system-on-a-chip (SoC), central processing unit (CPU), or graphics processing unit (GPU), among other integrated devices. This integrated device can be coupled to a system board, such as motherboard 411 for integration into a computing system. Various support circuitry (not shown for clarity), such as memory, storage, peripherals, power supplies, and other related circuitry, can be included on such a system board. System assembly 410 can comprise this system board, as well as other components.

In operation, dynamic power demands and electromagnetic interference concerns might warrant one or more sets of decoupling capacitors. Various decoupling capacitors can be placed onto system assembly 410 and package assembly 420, such as around perimeters of integrated circuit device 430 and package assembly 420. In FIG. 4, a first set of decoupling capacitors 412 are positioned onto motherboard 411. A second set of decoupling capacitors 422 are positioned onto package assembly 420. Decoupling capacitors 412 and 422 can reduce voltage fluctuations due to transient effects of integrated circuit device 430, as well as reduce susceptibility and emissions with regard to electromagnetic interference. However, due to the distances between decoupling capacitors 412 and 422 and relevant portions of integrated circuit device 430, relatively large current loops can be formed, leading to corresponding inductance on the affected voltage links of included power domains. These inductances, among other factors, can limit the transient speeds or maximum frequencies over which decoupling features are effective. When these decoupling features are not sufficient to reduce transients on voltage links, such as droops, dips, and spikes, among other transient events, then operation of integrated circuit device 430 can be reduced. Failures can even result during larger transient events and dynamic changes in power demands of integrated circuit device 430.

In FIG. 4, instead of various techniques such as increasing an input voltage level to compensate for transients on voltage links, or altering a quantity or arrangement of capacitors on motherboard 411 or package assembly 420, an enhanced arrangement is shown. Specifically, FIG. 4 shows power circuitry device 450 which is positioned onto integrated circuit device 430. Capacitance structures 451 of power circuitry device 450 can be individually connected to power features of integrated circuit device 430. Capacitance structures 451 can be connected using one or more through-silicon vias (TSVs) incorporated into integrated circuit device 430. In this manner, power circuitry device 450 can be positioned very near power features of integrated circuit device 430 to significantly decrease any distance between capacitance structures and affected power features. Any inductive loop distance/area can also be correspondingly reduced, leading to faster transient response for voltage domains. Thus, an actual supplied voltage level experiences much smaller deviations from a desired voltage level or circuit minimum voltage levels. Such assemblies formed with power circuitry device 450 and integrated circuit device 430 can improve a minimum voltage (Vmin) needed to supply a particular integrated circuit by 50-100 mV or more which translates into a 10-20% improvements in device power efficiency. If desired, these efficiency gains in Vmin operation can be translated into supplying a lower voltage level to the affected circuit, which can reduce power dissipation for processing cores of integrated circuit device 430 for a particular operating frequency. In addition, an increased operating frequency can alternatively be supported with these improvements to the voltage levels being supplied to integrated circuit device 430. In some examples, the voltage reduction resultant from a new Vmin can be used entirely for power savings without performance improvement for processing cores of integrated circuit device 430. Alternatively, some (or all) of the Vmin improvement can instead be used for performance improvement with increased operating frequencies for processing cores. Combinations of voltage reductions for power savings and increases in performance by operating frequency increases are also possible.

FIG. 4 employs a specialized integrated circuit chip or device (450) which includes both capacitance elements 451 and voltage adjustment circuitry 452. Capacitance elements 451 includes a semiconductor capacitor array comprising an integrated array of metal-oxide-semiconductor, metal-insulator-semiconductor, silicon (source, drain, and channel), or silicon gate (oxide/insulator) capacitance elements. Other forms and types of semiconductor-based capacitive elements can be employed. Various interconnect can be included to form groupings or personalized/customized configurations among capacitance elements 451. Additionally, interconnect is employed to couple terminals of various capacitance elements 451 to external interconnection features, such as conductive pads or external interfacing elements.

Power circuitry device 450 also includes voltage adjustment circuitry 452. Voltage adjustment circuitry 452 is representative of elements of power system 650 of FIG. 6, although variations are possible. Power circuitry device 450 includes capacitance elements 451 as mentioned above, but also includes further circuitry to control flow of power to integrated circuit device 430, which can include modification/alteration of voltage levels for one or more voltage domains of power circuitry device 450. A further discussion of these operations and elements is found in FIG. 5 below.

Power circuitry device 450 can be coupled mechanically and electrically to integrated circuit device 430 using external features included on both power circuitry device 450 and integrated circuit device 430, such as conductive pads. Solder bumps or controlled collapse chip connections (C4) can be employed to couple pads of integrated circuit device 430 to pads of power circuitry device 450. Power circuitry device 450 can be bonded to integrated circuit device 430 in a "flip-chip" configuration, where a top side of power circuitry device 450 comprises the conductive pads for coupling to pads of integrated circuit device 430. Moreover, integrated circuit device 430 can be in a flip-chip configuration for bonding of a top-side of integrated circuit device 430 to package carrier 420, and with a bottom-side of integrated circuit device 430 comprising the conductive pads to couple to power circuitry device 450. In this matter, a direct connection through associated conductive pads and solder bumps can be established between integrated circuit device 430 and power circuitry device 450. It should be understood that the flip-chip configuration need not be employed to couple integrated circuit device 430 and power circuitry device 450, and the top-side/bottom-side terminology is merely exemplary. Power circuitry device 450 and integrated circuit device 430 can each be a thinned device where a back or bottom substrate portion is shaved or etched thinner to reduce a thickness for enhanced thermal dissipation or reduction in stackup height.

Selected ones of the external conductive pads of integrated circuit device 430 are further conductively coupled to associated TSVs 431 included in integrated circuit device 430. TSVs 431 are conductively coupled to various power domains and power features within integrated circuit device 430. One or more among TSVs 431 can also carry communication and control signaling between integrated circuit device 430 and power circuitry device 450, such as for indicating selected voltage levels for voltage adjustment circuitry of power circuitry device 450. TSVs 431 are formed during or after fabrication of integrated circuit device 430 using various manufacturing techniques to etch, drill, or otherwise penetrate through several layers of integrated circuit device 430 to form a conductive link between a desired power layer/domain and an externally-facing chip interface via a conductive pad. TSVs 431 might penetrate an entire thickness of integrated circuit device 430. TSVs 431 can optionally couple to power/voltage domain interconnect/planes or power distribution features integrated into integrated circuit device 430. Personalization or customization among the electrical connections made between capacitance elements and integrated circuit device power features can be achieved. This personalization can comprise differences in metallization layering or interconnect features included in power circuitry device 450 or in one or more layers of integrated circuit device 430 when discrete capacitors are employed. Power circuitry device 450 can include interconnect to couple capacitance structures into groups or zones. Power circuitry device 450 can include conductive pads on a 'top' side to couple to TSVs of integrated circuit device 430 via solder features in a stacked integrated circuit process.

Figure 5:
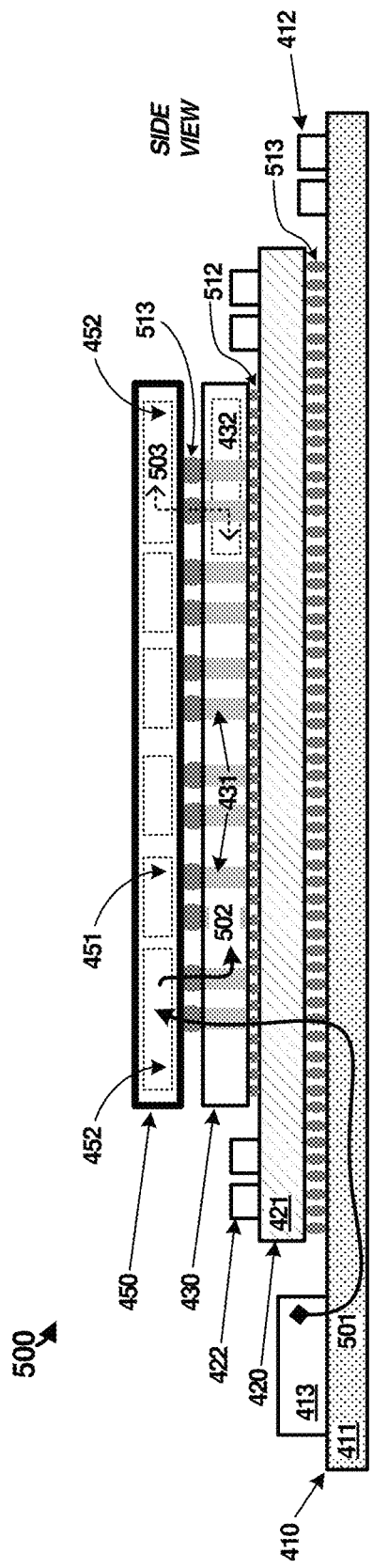
FIG. 5 illustrates a side view of an integrated circuit assembly in an implementation.

FIG. 5 illustrates side view 500 of an integrated circuit arrangement with a stacked power circuitry device 450 in an implementation. FIG. 5 includes a side view of arrangement 500 to illustrate a stackup among system assembly 410, package assembly 420, integrated circuit device 430, and power circuitry device 450. A heat sink can also be added onto power circuitry device 450 in the stackup, with any appropriate thermal paste provided between power circuitry device 450 and the heat sink. Although similar elements as found in FIGS. 1-4 are shown in FIG. 5, it should be understood that other elements can instead be included. Also, at least the (through-silicon via) TSV elements in FIG. 5 are not drawn to scale, and instead are sized to enhance clarity in the associated discussion.

FIG. 5 shows a stackup of elements which form an assembly. At a bottom of the stackup in FIG. 5, system assembly 410 is shown having motherboard 411 with one or more perimeter decoupling capacitors 412. Further circuitry can be included in system assembly 410, such as memory, storage, peripherals, power circuitry, and other similar elements. These are not shown in FIG. 5 for clarity. Integrated circuit device 430 comprises a semiconductor die which is bonded to carrier circuit board 421 of package assembly 420. This configuration might comprise a flip-chip configuration, although other configurations are possible. Solder balls 512 couple integrated circuit device 430 to carrier 421 to form package assembly 420, along with other circuit which might include perimeter decoupling capacitance 422. Package assembly 420 is also coupled using solder balls 513 to system assembly 410.

Power circuitry device 450 comprises semiconductor capacitance elements 451 and voltage adjustment circuitry 452. Capacitance elements 451 are employed as decoupling capacitance for integrated circuit device 430. Capacitance elements 451 conductively couple to one or more voltage domains of integrated circuit device 430 over associated conductive pads and selected ones of TSVs 431. Voltage adjustment circuitry 452 comprises various circuitry for adjusting input voltage levels provided to integrated circuit device 430. This circuitry can comprise voltage modification circuitry in some examples, such as voltage regulators, switching or linear voltage conversion circuitry, DC-DC converter circuitry, and other circuitry. Further example operations of voltage adjustment circuitry 452, and control thereof, are discussed below for FIGS. 6-8.

In FIG. 5, capacitance elements 451 might be representative of one or more capacitive zones that can each comprise a plurality of semiconductor capacitors provided by power circuitry device 450. Semiconductor capacitors of these possible capacitance zones can be coupled together at common electrical terminals, such as connecting all capacitors of the zone at a positive terminal to $V_{DD}$ and at a negative terminal to ground, among other voltage configurations. Then, personalization/customization interconnect can be used to couple individual capacitance zones together and correlate these zones to particular voltage/power domains of integrated circuit device 430. For each capacitive zone, one set of personalization interconnect might be coupled to a supply voltage (such as $V_{DD}$) and another set of personalization interconnect might be coupled to a reference voltage (such as ground). In this manner, decoupling capacitance is positioned very close to affected circuitry of integrated circuit device 430, and individual capacitance zones formed among capacitance elements 451 can be grouped or lumped together for individual voltage/power domains. TSVs of integrated circuit device 430 would couple over conductive pads and solder bumps 513 to capacitance zones through any associated personalization interconnect.

Control circuitry 432 comprises power control elements for indicating selected voltage levels to voltage adjustment circuitry 452 over at least control signaling 503. Voltage adjustment circuitry 452, or alternatively, power control circuitry 413, can receive control instructions from control circuitry 432 and responsively provide voltages at specified levels. Control circuitry 432 can be programmed by one or more external systems to initiate voltage control of at least voltage adjustment circuitry 452. During performance testing, such as the voltage minimization or optimization testing described herein, control circuitry 432 can direct appropriate voltage changes by at least voltage adjustment circuitry 452 in accordance with performance testing and boot processes. Control circuitry 432 can also instruct any on-die power regulators of integrated circuit device 430, if employed.

Control circuitry 432 can be employed to determined Vmin values for one or more voltage domains of integrated circuit device 430. In one example, one or more supply voltages can be delivered to power circuitry device 450 from external power supply circuitry 413, and voltage adjustment circuitry 452 can modify these supply voltage levels into one or more input voltage levels for integrated circuit device 430 in accordance with instructions received from control circuitry 432. Control circuitry 432 can control voltage adjustment circuitry 452 to provide associated learned Vmin values having any appropriate margin added thereto. In such examples, voltage adjustment circuitry 452 can receive the one or more supply voltages over conductive pads of power circuitry device 450 which are coupled to TSVs of integrated circuit device 430. These TSVs can carry the one or more supply voltages through the body of integrated circuit device 430 to power circuitry device 450. Power flow 501 illustrates delivery of power comprising one or more supply voltages to power circuitry device 450 and voltage adjustment circuitry 452. Then, voltage adjustment circuitry 452 produces one or more modified input voltages that can be delivered to integrated circuit device 430 over one or more conductive pads between power circuitry device 450 and integrated circuit device 430. Power flow 502 illustrates delivery of power comprising one or more input voltages to integrated circuit device 430.

In alternative implementations, voltage adjustment circuitry 452 might include similar elements discussed for control circuitry 432 with regard to performance testing, voltage minimization operations, or voltage optimization operations for integrated circuit device 430. In another example, voltage adjustment circuitry 452 controls voltage levels of one or more input voltages provided to integrated circuit device 430. Control lines can be coupled through one or more TSVs or through non-TSV interconnect provided by integrated circuit device 430. For example, power supply circuitry 413 might generate one or more supply voltages for delivery over motherboard 411 to integrated circuit device 430. These one or more supply voltages can be delivered over solder balls 513 to carrier circuit board 421, and over solder balls 512 to integrated circuit device 430. Voltage adjustment circuitry 452 can monitor voltage levels provided by power supply circuitry 413, instruct power supply circuitry 413 to alter voltage levels in accordance with a voltage optimization or minimization process, and instruct integrated circuit device 430 to execute one or more iterative performance tests for incremental values of the one or supply voltage levels. Once minimized or optimized voltages have been found, then voltage adjustment circuitry 452 can instruct power supply circuitry 413 to supply these voltage levels to integrated circuit device 430. Various interconnect through TSVs 431 or conductive interconnect between power circuitry device 450 and integrated circuit device 430 can carry communication and control signaling between voltage adjustment circuitry 452 and power supply circuitry 413.

In yet another alternative implementation, voltage adjustment circuitry 452 controls voltage levels of one or more internal voltages established by voltage control circuitry internal to integrated circuit device 430. Control lines can be coupled through one or more TSVs or through non-TSV interconnect provided by integrated circuit device 430. Power supply circuitry 413 might generate one or more supply voltages for delivery over motherboard 411 to integrated circuit device 430. These one or more supply voltages can be delivered over solder balls 513 to carrier circuit board 421, and over solder balls 512 to integrated circuit device 430. Voltage control circuitry internal to integrated circuit device 430 can be employed to modify these one or more supply voltages for in-die usage by integrated circuit device 430. Voltage adjustment circuitry 452 can monitor voltage levels provided by power supply circuitry 413, instruct voltage control circuitry internal to integrated circuit device 430 to alter voltage levels in accordance with a voltage optimization or minimization process, and instruct processing cores of integrated circuit device 430 to execute one or more iterative performance tests for incremental values of the one or supply voltage levels. Once minimized or optimized voltages have been found, then voltage adjustment circuitry 452 can instruct voltage control circuitry internal to integrated circuit device 430 to alter supply voltage levels into internal voltage levels for use by integrated circuit device 430. Various interconnect through TSVs 431 or conductive interconnect between power circuitry device 450 and integrated circuit device 430 can carry communication and control signaling between voltage adjustment circuitry 452 and voltage control circuitry internal to integrated circuit device 430.

A final assembly having elements 410, 420, 430, 450, and an optional heat sink would provide substantially improved power supply decoupling for integrated circuit device 430 that allows for improved performance and/or reduced power supply voltages due to decreased power supply noise. The closely-positioned decoupling capacitance can lead to better dynamic performance on any associated voltage lines and voltage domains of integrated circuit device 430, allowing for lower operating voltages for the domains of integrated circuit device 430, and hence lower power. Improved circuit operating voltage minimum (Vmin) values can be found which have less dynamic variation in voltage levels provided to the individual power domains of integrated circuit device 430. Any voltage optimization techniques which might be applied to reduce supply voltages to integrated circuit device 430 can also benefit from this closely-positioned decoupling capacitance. Specifically, a reduced magnitude of transient effects on voltage domains from the close decoupling capacitance can also correspond to reduced voltage levels needed to be supplied to a given circuit.

An assembly having integrated circuit device 430 and power circuitry device 450 might have additional stacked integrated circuits or semiconductor devices on top of power circuitry device 450, such as memory devices, further processors, additional capacitance chips, and the like. Additional TSVs can be included within power circuitry device 450 to accommodate connections to power supply domains and other signaling between integrated circuit device 430, power circuitry device 450, and the additional stacked chips. At some quantity of additional stacked devices, the stackup may be limited by the total power consumption of all stacked devices and the ability to remove heat from the structure. Power circuitry device 450 might located at any vertical position in the stackup or sandwich of integrated devices, such as in a middle or top layer. Using an inner layer of the stack might be the more appropriate to keep the effectiveness of the decoupling capacitance, but applications and designs can vary. In fact, more than one power circuitry device 450 might be included in larger stackups.

Figure 6:
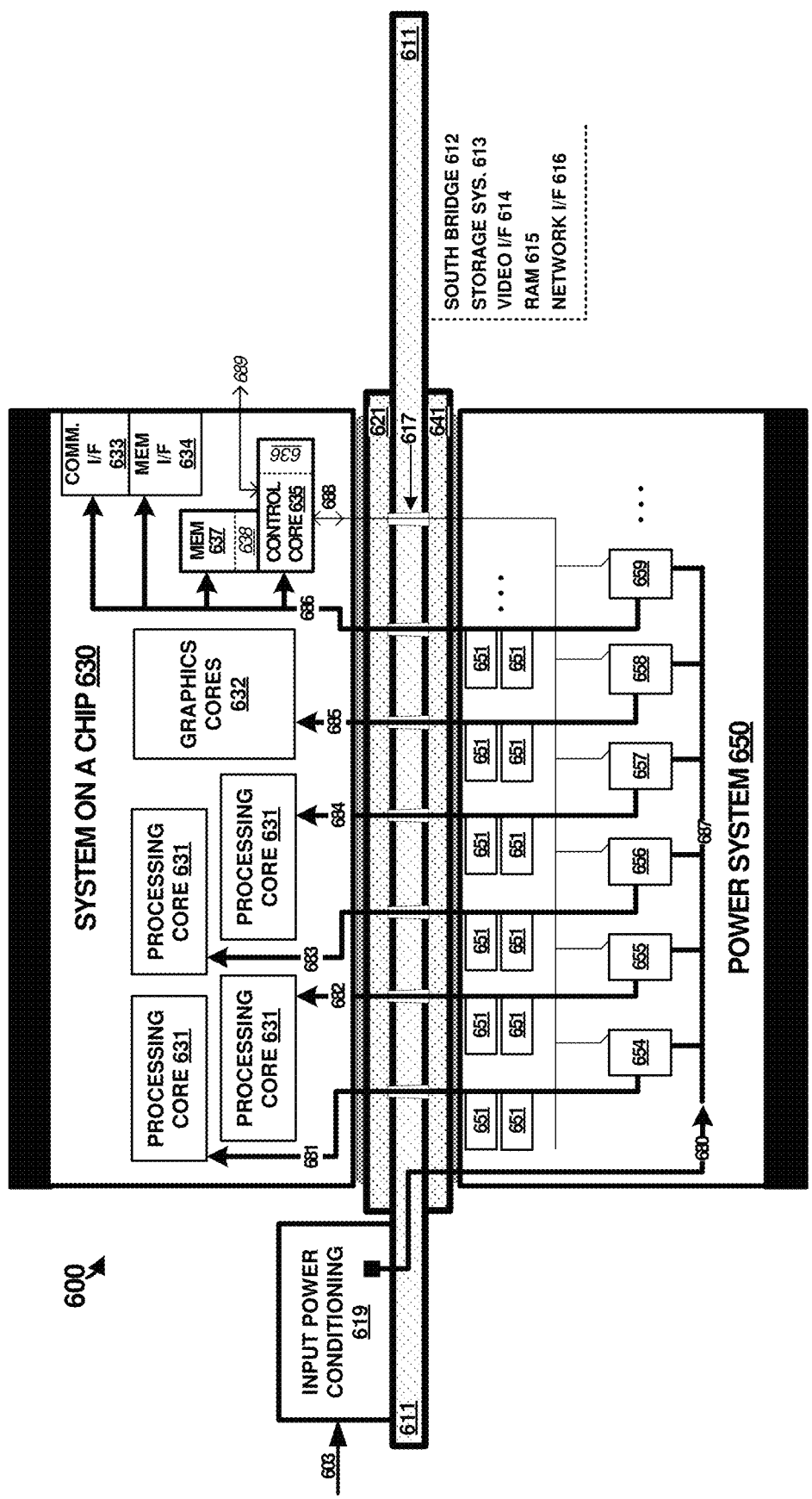
FIG. 6 illustrates a computing system in an implementation.

As a further example of power control within example computing environments and systems, FIG. 6 is presented. FIG. 6 illustrates computing system 600 that is representative of any system or collection of systems in which the various operational architectures, platforms, scenarios, and processes disclosed herein may be implemented. For example, computing system 600 can be used to implement any of the integrated circuit arrangements discussed herein, such as integrated circuit arrangement 100 of FIG. 1 or integrated circuit arrangement 400 of FIG. 4, among others.

Examples of computing system 600 include, but are not limited to, a gaming console, smartphone, tablet computer, laptop, server, personal communication device, personal assistance device, wireless communication device, subscriber equipment, customer equipment, access terminal, telephone, mobile wireless telephone, personal digital assistant, personal computer, e-book, mobile Internet appliance, wireless network interface card, media player, or some other computing apparatus, including combinations thereof.

Computing system 600 may be implemented as a single apparatus, system, or device or may be implemented in a distributed manner as multiple apparatuses, systems, or devices. Computing system 600 includes, but is not limited to, motherboard 611, system on a chip (SoC) device 630, and power system 650. Various contextual or peripheral elements can be included in computing system 600, such as mounted to motherboard 611 or included on separate circuit boards. These elements include south bridge 612, storage system 613, video interfaces 614, random-access memory (RAM) 615, and network interfaces 616. Furthermore, input power conditioning circuitry 619 and optional thermal management elements 660-661 can be included. SoC device 630 can be optionally mounted to carrier circuit board 621 instead of directly to motherboard 611. Power system 650 can be optionally mounted to carrier circuit board 641 instead of directly to motherboard 611.

Referring still to FIG. 6, SoC device 630 may comprise a micro-processor and processing circuitry that retrieves and executes software from storage system 613 and RAM 615. Software can include various operating systems, user applications, gaming applications, multimedia applications, or other user applications. SoC device 630 may be implemented within a single processing device, but may also be distributed across multiple processing devices or sub-systems that cooperate in executing program instructions. Examples of SoC device 630 include general purpose central processing units, application specific processors, graphics processing units, and logic devices, as well as any other type of processing device, combinations, or variations thereof. In FIG. 6, SoC device 630 includes processing cores 631, graphics cores 632, communication interfaces 633, memory interfaces 634, control core 635, and auxiliary memory 637, among other elements. Some of the noted elements of SoC device 630 can be included in a north bridge portion of SoC device 630. Elements of control core 635 and auxiliary memory 637 might be included in circuitry external to SoC device 630. SoC device 630 is operatively coupled with other elements in computing system 600 external to SoC device 630, such as south bridge 612, storage system 613, video interfaces 614, RAM 615, and network interfaces 616.

Data storage elements of computing system 600 include storage system 613 and RAM 615. Storage system 613 and RAM 615 may comprise any computer readable storage media readable by SoC device 630 and capable of storing software. Storage system 613 and RAM 615 may include volatile and nonvolatile, removable and non-removable media implemented in any method or technology for storage of information, such as computer readable instructions, data structures, program modules, or other data. Examples of storage media include dynamic random access memory (DRAM), static random access memory (SRAM), read only memory, magnetic disks, optical disks, flash memory, virtual memory and non-virtual memory, magnetic disk storage or other magnetic storage devices, or any other suitable storage media. Storage system 613 may comprise additional elements, such as a controller, capable of communicating with SoC device 630 or possibly other systems.

South bridge 612 includes interfacing and communication elements which can provide for coupling of SoC device 630 to peripherals, user input devices, user interface devices, printers, microphones, speakers, or other external devices and elements. In some examples, south bridge 612 includes a system management bus (SMB) controller or other system management controller elements.

Video interfaces 614 comprise various hardware and software elements for outputting digital images, video data, audio data, or other graphical and multimedia data which can be used to render images on a display, touchscreen, or other output devices. Digital conversion equipment, filtering circuitry, image or audio processing elements, or other equipment can be included in video interfaces 614.

Network interfaces 616 can provide communication between computing system 600 and other computing systems (not shown), which may occur over a communication network or networks and in accordance with various communication protocols, combinations of protocols, or variations thereof. Example networks include intranets, internets, the Internet, local area networks, wide area networks, wireless networks, wired networks, virtual networks, software defined networks, data center buses, computing backplanes, or any other type of network, combination of network, or variation thereof. The aforementioned communication networks and protocols are well known and need not be discussed at length here. However, some communication protocols that may be used include, but are not limited to, the Internet protocol (IP, IPv4, IPv6, etc.), the transmission control protocol (TCP), and the user datagram protocol (UDP), as well as any other suitable communication protocol, variation, or combination thereof.

Computing system 600 can also comprise one or more enclosures that can include various structural support elements, cases, chassis elements, or other elements that house and structurally support the further elements of computing system 600. Optional thermal management elements 660-661 can include heatsinks, fans, heat pipes, heat pumps, refrigeration elements, or other elements to manage and control temperature of an optional enclosure and computing system 600. Typically, thermal management elements 660-661 are included for SoC device 630 or associated circuitry. Thermal monitoring elements can include one or more temperature sensors comprising thermocouples, silicon bandgap temperature sensors, thermistors, resistance temperature detectors (RTDs), other temperature sensing elements.

Input power conditioning 619 can include filtering, surge protection, electromagnetic interference (EMI) protection and filtering, as well as perform other input power functions for input power 603. In some examples, input power conditioning 619 includes AC-DC conversion circuitry, such as transformers, rectifiers, power factor correction circuitry, or switching converters. When a battery source is employed as input power 603, then input power conditioning 619 can include various diode protection, DC-DC conversion circuitry, or battery charging and monitoring circuitry. Some of the elements of power system 650 might be included in input power conditioning 619.

As mentioned above, SoC device 630 includes many different internal elements and structures, such as processing cores 631, graphics cores 632, communication interfaces 633, memory interfaces 634, control core 635, and auxiliary memory 637. However, each of these internal elements might be associated with a separate or dedicated power domain, or one or more of these internal elements might be serviced by multiple power domains. A power domain can comprise a set of power links, planes, distribution structures, or interconnect which is independent within SoC device 630 from other power domains. Power distribution structures of each power domain can receive input voltages having different voltage levels, which may be independently varied based on a voltage optimization process described herein. For example, processing cores 631 might all prefer a nominal input voltage level ($V_{DD}$) of 1.00 VDC, but variations in this nominal input voltage level can be determined based on performance testing executed for SoC device 630. In such examples, individual processing cores 631 might be able to be operated at exemplary voltage levels 0.950 VDC, 0.925 VDC, 0.900 VDC, and 0.912 VDC. Other power domains can have other voltage levels determined.

Power system 650 includes a plurality of decoupling capacitance elements 651, a plurality of voltage adjustment units 654-659, and control core 635. Power system 650 receives supply power over link 680 from input power conditioning circuitry 619. Link 680 can represent more than one voltage link or power link. Internal power distribution link 687 delivers power received over power link 680 to individual voltage adjustment units 654-659. Voltage adjustment units 654-659 individually alter voltage levels to produce input power for delivery to individual power domains of SoC device 630. SoC device 630 receives power over input power links 681-686 as supplied by the plurality of voltage adjustment units 654-659.

Decoupling capacitance elements 651 each comprise capacitors formed from semiconductor capacitance elements, which might further comprise groups or zones of many small semiconductor capacitors. Capacitance elements 651 can comprise similar elements as capacitance elements 451 of FIGS. 4-5, although variations are possible. In FIG. 6, two capacitance elements 651 are shown coupled to each input power link 681-686. Each power link can be further routed over vias 617 which penetrate at least a portion of motherboard 611. In this manner, capacitance elements 651 are positioned very close electrically to SoC device 630. Although two example capacitance elements 651 are shown for each power link, it should be understood that other quantities can instead be employed.

Voltage adjustment units 654-659 can provide input voltages at associated current levels to SoC device 630. In many examples, each voltage adjustment unit can convert or alter a supply voltage of link 687 to a different output voltage on associated links 681-686, along with any related voltage regulation. Voltage adjustment units 654-659 might receive supply power over link 687 at a first voltage level and convert this first voltage level into second voltage levels. These second voltage levels can be different among each of voltage adjustment units 654-659, and each can correspond to a different power domain of SoC 630. Voltage adjustment units 654-659 comprise various power electronics, power controllers, DC-DC conversion circuitry, power transistor gate modulation circuitry, power transistors, half-bridge elements, filters, passive components, and other elements to convert supply power received over link 687 into input power usable by SoC device 630.

Control core 635 can instruct voltage adjustment units 654-659 over at least link 688 to provide particular voltage levels for one or more voltage domains of SoC device 630. Control core 635 can instruct voltage adjustment units 654-659 to provide particular voltage levels for one or more operational modes, such as normal, standby, idle, and other modes. Control core 635 can receive instructions via external control link 689, which may comprise one or more programming registers, application programming interfaces (APIs), or other components. Control core 635 can provide status over link 689, such as temperature status, power phase status, current/voltage level status, or other information.

Control core 635 comprises a processing core separate from processing cores 631 and graphics cores 632. Control core 635 might be included in separate logic or processors external to SoC device 630 in some examples. Control core 635 typically handles initialization procedures for SoC device 630 during a power-on process or boot process. Thus, control core 635 might be initialized and ready for operations prior to other internal elements of SoC device 630. Control core 635 can comprise power control elements, such as one or more processors or processing elements, software, firmware, programmable logic, or discrete logic. Control core 635 can execute a voltage minimization process or voltage optimization process for integrated circuit device 630. In other examples, control core 635 can include circuitry to instruct external power control elements and circuitry to alter voltage levels provided to integrated circuit device 630, or interface with circuitry external to SoC device 630 to cooperatively perform the voltage minimization process or voltage optimization process for integrated circuit device 630.

Control core 635 can comprise one or more microprocessors and other processing circuitry. Control core 635 can retrieve and execute software or firmware, such as firmware 636 comprising power control firmware, power monitoring firmware, and voltage optimization or minimization firmware from an associated storage system, which might be stored on portions of storage system 613, RAM 615, or auxiliary memory 637. Control core 635 can be implemented within a single processing device but can also be distributed across multiple processing devices or sub-systems that cooperate in executing program instructions. Examples of control core 635 include general purpose central processing units, application specific processors, and logic devices, as well as any other type of processing device, combinations, or variations thereof. In some examples, control core 635 comprises a processing core separate from processing cores 631, a hardware security module (HSM), hardware security processor (HSP), security processor (SP), trusted zone processor, trusted platform module processor, management engine processor, microcontroller, microprocessor, FPGA, ASIC, application specific processor, or other processing elements. One example implementation of control core 635 is shown as power control system 710 of FIG. 7, although variations are possible.

During power-on operations or boot operations, control core 635 instructs power system 650 to provide power to SoC device 630 according to voltage identifiers (VIDs) and applies any offsets or margins determined from a voltage minimization process or voltage optimization process. These VID-indicated voltages can be stored in data structures 638 in auxiliary memory 637, among other implementations. VIDs can be considered 'default' voltages that are typically specified according to a manufacturer specification or hard-coded by a manufacturer using electronic fuses (e-fuses). In some examples, once these VIDs are set by a manufacturer, they cannot be altered by an operator or user of SoC device 630. The VIDs typically comprise a normalized value or encoded bits which are used to derive an actual voltage for driving SoC device 630.

Once at least control core 635 is powered on after receiving input power from power system 650 according to the VIDs, then control core 635 can read voltage offsets from data structures 638 in auxiliary memory 637. These voltage offsets are determined in a voltage minimization or optimization process, such as described herein, and stored in auxiliary memory 637 for later usage. Example voltage offsets can indicate an incremental offset for a plurality of voltage or power domains, which can include positive or negative offsets. The voltage offsets might be stored in auxiliary memory 637 using a secure storage process, such as a digitally signed security process. A security process executed by control core 635 can authenticate the voltage offsets and ensure that tampering or alteration was not performed. The security process can include public-private key encryption techniques or other digital signature/authentication or data encryption techniques.

The voltage values determined from the voltage minimization or optimization process can be stored into a memory device or data structure along with other corresponding information, such as time/date of the functional tests, version information for the functional tests, or other information. The version identifier can be used to provide special handling of results determined by different revisions of system 600. This data structure can be securely signed by a hardware security module (HSM) to ensure that the stored voltage information and related information is authentic. A digital signature for the data structure can be validated during each subsequent boot of SoC device 630, and used as the selected operational voltage for the remainder of any factory/manufacturing tests and subsequent user site operation.

Control core 635 can generate a voltage settings table in a secure memory using VIDs and voltage offsets. This secure memory might include portions of memory 637, such as to include data structures 683. In some examples, control core 635 adds voltages that correspond to the VIDs to the voltage offsets and generates new VIDs which are stored in secure memory. These new VIDs can be presented to voltage adjustment units 654-659 which responsively implement input voltages for SoC device 630 that correspond to the VIDs/offsets. Various margins or adjustments to the new VIDs or other voltage information can be made during operation of SoC device 630, such as to add additional margins, implement end-of-life (EoL) margins, or other features. In typical examples, only control core 635 can access the secure memory, and processing cores 631 or graphics cores 632 cannot access the secure memory. Thus, a user-level application run in an operating system cannot typically directly modify VIDs/offsets. However, control core 635 might still receive requests from various software, drivers, hypervisors, or other elements to change VIDs responsive to user commands or other alteration inputs.

Figure 7:
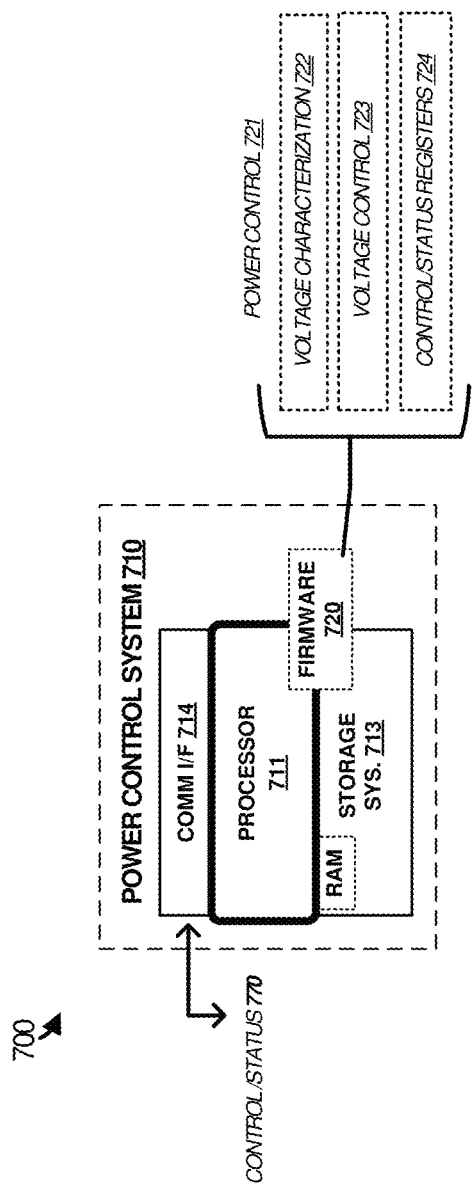
FIG. 7 illustrates a power control system in an implementation.

FIG. 7 illustrates power control system 710 that is representative of any system or collection of systems from which the various performance testing and power control operations can be directed. Any of the power control and control of performance testing employed in the operational architectures, platforms, scenarios, and processes disclosed herein may be implemented using elements of power control system 710. In one implementation, power control system 710 is representative of at least a portion of control circuitry 432 of FIG. 4 or control core 635 of FIG. 6. Power control system 710 might also include elements of an external system, such as a manufacturing system communicatively coupled to control circuitry 432 of FIG. 4 or control core 635 of FIG. 6.

Power control system 710 may be implemented as a single apparatus, system, or device or may be implemented in a distributed manner as multiple apparatuses, systems, or devices. Power control system 710 includes, but is not limited to, processor 711, storage system 713, communication interface system 714, and firmware 720. Processor 711 is operatively coupled with storage system 713 and communication interface system 714.

Processor 711 loads and executes firmware 720 from storage system 713. Firmware 720 includes power control 721, which is representative of the processes discussed with respect to the preceding Figures and operations of FIG. 8. When executed by processor 711 to enhance power control and voltage optimization/minimization for target integrated circuit devices, firmware 720 directs processor 711 to operate as described herein for at least the various processes, operational scenarios, and sequences discussed in the foregoing implementations. Power control system 710 may optionally include additional devices, features, or functionality not discussed for purposes of brevity.

Referring still to FIG. 7, processor 711 may comprise a microprocessor and processing circuitry that retrieves and executes firmware 720 from storage system 713. Processor 711 may be implemented within a single processing device, but may also be distributed across multiple processing devices, sub-systems, or specialized circuitry, that cooperate in executing program instructions and in performing the operations discussed herein. Examples of processor 711 include general purpose central processing units, application specific processors, and logic devices, as well as any other type of processing device, combinations, or variations thereof.

Storage system 713 may comprise any computer readable storage media readable by processor 711 and capable of storing firmware 720. Storage system 713 may include volatile and nonvolatile, removable and non-removable media implemented in any method or technology for storage of information, such as computer readable instructions, data structures, program modules, or other data. Examples of storage media include random access memory (RAM), read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 713 may also include computer readable communication media over which at least some of firmware 720 may be communicated internally or externally. Storage system 713 may be implemented as a single storage device, but may also be implemented across multiple storage devices or sub-systems co-located or distributed relative to each other. Storage system 713 may comprise additional elements, such as a controller, capable of communicating with processor 711 or possibly other systems.

Firmware 720 may be implemented in program instructions and among other functions may, when executed by processor 711, direct processor 711 to operate as described with respect to the various operational scenarios, sequences, and processes illustrated herein. For example, firmware 720 may include program instructions for enhanced power control and voltage optimization/minimization for target integrated circuit devices, among other operations.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Firmware 720 may include additional processes, programs, or components, such as operating system software or other application software, in addition to that of power control 721. Firmware 720 may also comprise program code, scripts, macros, and other similar components. Firmware 720 may also comprise software or some other form of machine-readable processing instructions executable by processor 711.

In general, firmware 720 may, when loaded into processor 711 and executed, transform a suitable apparatus, system, or device (of which power control system 710 is representative) overall from a general-purpose computing system into a special-purpose computing system customized to facilitate enhanced power control and voltage optimization/minimization for target integrated circuit devices. Encoding firmware 720 on storage system 713 may transform the physical structure of storage system 713. The specific transformation of the physical structure may depend on various factors in different implementations of this description. Examples of such factors may include, but are not limited to, the technology used to implement the storage media of storage system 713 and whether the computer-storage media are characterized as primary or secondary storage, as well as other factors.

For example, if the computer readable storage media are implemented as semiconductor-based memory, firmware 720 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Power control 721 can include one or more software elements, such as an operating system, devices drivers, and one or more applications. These elements can describe various portions of power control system 710 with which power control elements, voltage optimization elements, or other elements interact. For example, an operating system can provide a software platform on which power control 721 is executed and allows for enhanced t power control and voltage optimization/minimization for target integrated circuit devices, among other operations.

In one example, voltage characterization service 722 is configured to direct execution of a performance test on a target integrated circuit device to determine at least system performance over one or more incrementally adjusted input voltages for a target integrated circuit device with contextual elements. The performance test can be executed on each of a plurality of voltage domains of a target integrated circuit device determine minimum operating voltages lower than a manufacturer specified operating voltage for at least one input voltage. Transfer of the performance test to a target integrated circuit device can occur over link 770 or other links. The performance test can comprise computer-readable instructions stored within storage system 713. The performance test might comprise a system image or bootable image which includes an operating system, applications, performance tests, voltage regulator control instructions, and other elements which are transferred over link 770 to a target integrated circuit device under test.

In some examples, the performance test for a target integrated circuit device comprises iteratively booting the target integrated circuit device into an operating system after reducing a voltage level of at least one supply voltage applied to at least one voltage domain of the target integrated circuit device. For each reduction in the at least one supply voltage, the performance test includes executing a voltage characterization service to perform one or more functional tests that run one or more application level processes in the operating system and exercise processor core elements and interface elements of the target integrated circuit device in context with a plurality of elements external to the target integrated circuit device which share the at least one supply voltage. The performance test also includes monitoring for operational failures of at least the target integrated circuit device during execution of the voltage characterization service, and based at least on the operational failures, determining at least one resultant supply voltage, wherein the at least one resultant supply voltage relates to a power consumption for the target integrated circuit device. Iterative booting of the target integrated circuit device can comprise establishing a minimum operating voltage for the at least one supply voltage based on a current value of the iteratively reduced voltages, adding a voltage margin to the minimum operating voltage to establish the at least one resultant supply voltage, and via voltage control 723, instructing voltage regulator circuitry of a power control system (such as voltage adjustment units 654-659 of power system 650 in FIG. 6) to supply the at least one resultant supply voltage to the target integrated circuit device for operation of the target integrated circuit device.

Voltage control 723 includes elements which control voltage regulation or voltage adjustment circuitry of a power control system or power control circuitry. Voltage control 723 can indicate target or desired voltage levels to be provided to one or more voltage domains of a target integrated circuit device, such as by instructing power control circuitry to alter voltage levels of one or more voltage control units, voltage phases, or voltage regulator circuits. Voltage control 723 can receive input from voltage control circuitry which indicates present voltage levels, power consumption levels, temperature levels, or other metrics that indicate present operation of voltage control circuitry, voltage regulation circuitry, and target integrated circuit devices, among other elements. Voltage control 723 can also control switching elements, switching logic, or transistor-level transfer elements which control flow of power to a target integrated circuit device or other elements in context with a target integrated circuit device.

Control/status registers 724 include one or more non-volatile memory elements which provide status of the operation of power control system 710 to external elements and system over link 770. Control over the operations of control/status registers 724 can also occur via modification or alteration of values stored within control/status registers 724, or of logic-coupled ones of control/status registers 724 which tie to operation of power control system 710. Reads/writes of ones of control/status registers 724 can occur over link 770 from one or more external systems, which may include a target integrated circuit device among other control systems and manufacturing systems. Various example control registers might include performance testing alteration and initiation control registers, performance testing status registers, manual setting of operating voltage levels or minimum/maximum voltage levels, as well as various identification information comprising serial numbers, model numbers, version numbers, and related information for both hardware and software elements.

Communication interface system 714 may include communication connections and devices that allow for communication over link 770 to communicate with a target integrated circuit device, as well as with control electronics, power control systems, voltage adjustment circuitry, voltage adjustment units, power regulator circuitry, power control circuitry, power supply circuitry, or with external systems (not shown in FIG. 7) over one or more communication networks (not shown). Examples of connections and devices that together allow for inter-system communication may include discrete control links, system management buses, serial control interfaces, register programming interfaces, network interface cards, antennas, power amplifiers, RF circuitry, transceivers, and other communication circuitry. The connections and devices may communicate over communication media to exchange packetized communications with other computing systems or networks of systems, such as metal, glass, air, or any other suitable communication media. Communication interface system 714 may include user interface elements, such as programming registers, control/status registers 724, APIs, or other user-facing control and status elements.

Communication between power control system 710 and other circuitry and systems (not shown in FIG. 7), may occur over a link 770 comprising a communicate link or a communication network or networks, and in accordance with various communication protocols, combinations of protocols, or variations thereof. These other systems can include target integrated circuit devices, power control systems, or manufacturing systems, among others. Communication interfaces might comprise system management bus (SMB) interfaces, inter-integrated circuit (I2C) interfaces, or other similar interfaces. Further examples include intranets, internets, the Internet, local area networks, wide area networks, wireless networks, wired networks, virtual networks, software defined networks, data center buses, computing backplanes, or any other type of network, combination of network, or variation thereof. Some example communication protocols that may be used include, but are not limited to, the Internet protocol (IP, IPv4, IPv6, etc.), the transmission control protocol (TCP), and the user datagram protocol (UDP), as well as any other suitable communication protocol, variation, or combination thereof.

Figure 8:
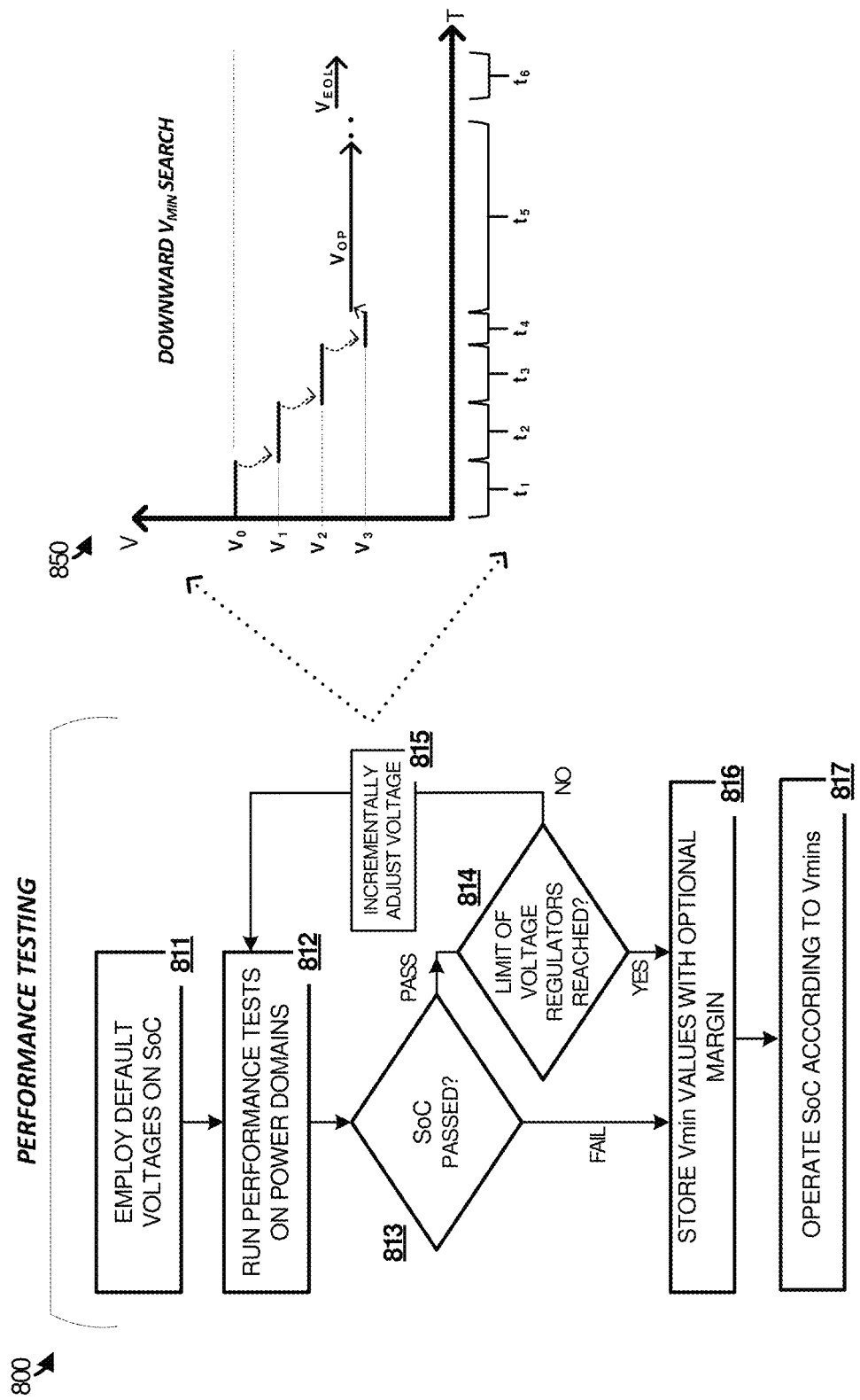
FIG. 8 illustrates a method of performance testing of an integrated circuit device in an implementation.

FIG. 8 is included to illustrate operation of performance testing to determine performance properties of target integrated circuit devices in computing systems. Specifically, FIG. 8 is a flow diagram illustrating a method of operating elements of power control circuitry in an implementation. This power control circuitry can comprise elements of integrated circuit device 130 in FIGS. 1-3, control circuitry 432 in FIG. 4, control core 635 in FIG. 6, or power control system 710 in FIG. 7. In FIG. 8, a performance test is executed for a target integrated circuit device, such as integrated circuit device 130 in FIG. 1, integrated circuit device 430 in FIG. 4, or SoC device 630 in FIG. 6. For purposes of example, the operations below are executed in context with computing system 600, SoC device 630, and power system 650. In other examples, the operations of FIG. 8 can be performed by elements of FIG. 7, such as power control system 710.

This performance test can be initiated by control core 635 and executed by processing cores or processing elements of SoC device 630. SoC device 630 is typically booted into an operating system to run the performance testing of FIG. 8. During execution of the performance test on SoC device 630, supply voltages will be incrementally adjusted by control core 635 and power system 650 to determine minimum functional operating voltage levels. In one example, this performance test includes incrementally adjusting at least one supply voltage by initially operating one or more voltage domains of SoC device 630 at a first supply voltage lower than a manufacturer specified operating voltage and progressively lowering the supply voltage in predetermined increments while performing the functional test and monitoring for occurrence of the operational failures. In another example, this performance test includes incrementally adjusting at least one supply voltage by initially operating one or more voltage domains of SoC device 630 at a first supply voltage lower than a manufacturer specified operating voltage and progressively raising the supply voltage in predetermined increments while performing the functional test and monitoring for occurrence of the operational failures.

In manufacturing operations, a computing system comprising SoC device 630 is built and then tested individually according to a performance test. After the performance test has characterized SoC device 630 for minimum operating voltage plus any applicable voltage margin, SoC device 630 can be operated normally using these voltages. This performance test determines minimum supply voltages for proper operation of SoC device 630, which also relates to a power consumption of SoC device 630. Voltage is related to power consumption by Ohm's law and Joule's first law, among other relationships, and thus a lower operating voltage typically corresponds to a lower operating power for SoC device 630. Power consumption relates to an operating temperature, giving similar workloads for SoC device 630. Thus, the voltage adjustment method discussed in FIG. 8 allows power control circuitry to determine appropriate reduced input voltages for SoC device 630, resulting in power savings for computing system 600.

A processing device, such as SoC device 630 of FIG. 6, is incorporated into a computing system, such as computing system 600. SoC device 630 and carrier circuit board 621 is shown installed into motherboard 611. SoC device 630 also includes many contextual assembly elements, such as seen for south bridge 612, storage elements 613, video interfaces 614, random-access memory 615, and network interfaces 616. In many examples, SoC device 630 is installed into computing system 600 during a system assembly process before testing and further assembly. Thus, the hardware and software elements included in computing system 600 are typically the actual contextual elements for operating SoC device 630 once installed into a computing system.

Control core 635 initially employs (811) default voltages to provide power to SoC device 630. For example, control core 635 can instruct power system 650 to provide input voltages over associated power links according to manufacturer-specified operating voltages, which can be indicated by VID information 638 stored in auxiliary memory 637 or elsewhere and retrieved by control core 635. In other examples, such as when progressively rising voltages are iteratively provided to SoC device 630, the default voltages can comprise a starting point from which to begin raising voltage levels over time. In examples that employ incrementally rising voltages, starting voltages might be selected to be sufficiently low enough and less than those supplied by a manufacturer. Other default voltage levels can be employed. Once the input voltages are provided, SoC device 630 can initialize and boot into an operating system or other functional state.

An external system might transfer one or more functional tests for execution by SoC device 630 after booting into an operating system. A manufacturing system can transfer software, firmware, or instructions to control core 635 over link 689 to initiate one or more functional tests of SoC device 630 during a voltage adjustment process. These functional tests can be received over communication interface 633 of SoC device 630 and can comprise performance tests that exercise the various integrated elements of SoC device 630 as well as the various contextual assembly elements of SoC device 630. Portions of the voltage adjustment process or functional tests can be present before boot up to adjust input voltages for SoC device 630, such as by first initializing a first portion of SoC device 630 before initializing second portions.

Once SoC device 630 can begin executing the functional test, control core 635 drives one or more performance tests on each of the power domains (812) of SoC device 630. These power domains can include different input voltages and different input voltage levels. The functional tests can exercise two or more of the power domains simultaneously, which might further include different associated clock signals to run associated logic at predetermined frequencies. The functional tests can include operations initiated simultaneously on more than one processing core to produce both DC power demand and dynamic/AC power demand for the processing cores, graphics cores, and interfacing cores that replicates real-world operations. Moreover, the functional tests include processes that exercise elements of SoC device 630 in concert with elements 612-616, which might include associated storage devices, memory, communication interfaces, thermal management elements, or other elements.

The performance tests will typically linger at a specific operating voltage or set of operating voltages for a predetermined period of time, as instructed by any associated control firmware or software. This predetermined period of time allows for sufficient execution time for the functional tests to not only exercise all desired system and processor elements but also to allow any errors or failures to occur. The linger time can vary and be determined from the functional tests themselves, or set to a predetermined time based on manufacturing/testing preferences. Moreover, the linger time can be established based on past functional testing and be set to a value which past testing indicates will capture a certain population of errors/failures of system processors in a reasonable time.

If SoC device 630 does not experience failures or errors relevant to the voltage adjustment process during the linger time, then the specific input voltages employed can be considered to be sufficiently high to operate SoC device 630 successfully (813). Thus, the particular iteration of input voltage levels applied to SoC device 630 is considered a 'pass' and another progressively adjusted input voltage can be applied. As seen in operation (815) of FIG. 8, input voltages for SoC device 630 can be incrementally lowered, SoC device 630 restarted, and the functional tests executed again for the linger time. A restart of SoC device 630 might be omitted in some examples, and further operational testing can be applied at a new voltage level for each linger timeframe in a continuous or repeating manner. This process is repeated until either lower limits of voltage adjustment circuitry, such as voltage regulators, associated with power system 650 have been reached (814), or relevant failures of SoC device 630 or contextual components of computing system 600 are experienced. This process is employed to determine reduced operating voltages for SoC device 630 in the context of the assembly elements of computing system 600. Once voltage adjustments for the associated power domains are found, indications of these voltage adjustments can be stored for later use at voltage 'minimums' (Vmins) in operation 816, optionally with margins appropriate for operational 'safety' to reduce undiscovered failures or errors during the functional testing.

The functional tests can comprise one or more applications, scripts, or other operational test processes that bring specific power domains up to desired power consumption and operation, which may be coupled with ensuring that SoC device 630 is operating at preferred temperature as well. These functional tests may also run integrity checks (such as checking mathematical computations or checksums which are deterministic and repeatable). Voltages provided by power system 650 to SoC device 630, as specified by an associated performance test control system and communicated to control core 635, can be lowered one incremental step at a time and the functional tests run for a period of time until a failure occurs. The functional tests can automatically handle all possible failure modes resulting from lowering the voltage beyond functional levels. The possible failures include checksum errors detected at the test application level, a kernel mode crash detected by the operating system, a system hang, or hardware errors detected by system processor resulting in "sync flood" error mechanisms, among others. All failure modes can be automatically recovered from for further functional testing. To enable automatic recovery, a watchdog timer can be included and started in a companion controller, such as a "System Management Controller" (SMC), Embedded Controller, control core 635, or other control circuitry. The functional tests can issue commands to the companion controller to initialize or reset the watchdog timer periodically. If the watchdog timer expires or SoC device 630 experiences a failure mode, the companion controller can perform a system reset for computing system 600 or SoC device 630. Failure modes that result in a system reset can prompt control core 635 to initialize SoC device 630 with 'default' or 'known good' voltage levels from power system 650. These default levels can include manufacturer specified voltages or include voltage levels associated with a most recent functional test 'pass' condition.

Once SoC device 630 initializes or boots after a failure during the functional tests, the failure can be noted by a failure process in the functional tests or by another entity monitoring the functional tests, such as a performance test control system or manufacturing system. The voltage level can then be increased a predetermined amount, which might comprise one or more increments employed during the previous voltage lowering process. The increase can correspond to 2-3 increments in some examples, which might account for test variability and time-to-fail variability in the functional tests.

The voltage values determined from the voltage adjustment process can be stored (816) by control core 635 into a memory device or data structure along with other corresponding information, such as time/date of the functional tests, version information for the functional tests, or other information. Control core 635 might store these voltage values in auxiliary memory 637 or in one or more data structures 638 which indicate absolute values of voltage values or offset values of voltage values from baseline voltage values. Control core 635 might communicate the above information to an external system over link 689, such as a manufacturing system or performance test control system. Other stored information can include power consumption peak values, average values, or ranges, along with 'bins' into which each computing module is categorized. Stored voltage information can be used during power-on operations of computing system 600 to establish voltage levels (817) to be provided by control core 635 to voltage adjustment units of power system 650. The resulting computing module characteristics (e.g. power levels and thermal attributes) are substantially improved after the voltage adjustment process is completed. Thus, the voltage adjustment process described above allows systems to individually determine appropriate reduced operating voltages during a manufacturing or integration testing process, and for testing performed in situ after manufacturing occurs. Testing can be performed to determine changes in minimum operating voltages after changes are detected to SoC device 630, contextual elements 612-616, or periodically after a predetermined timeframe.

The iterative voltage search procedure can be repeated independently for each power domain and for each power state in each domain where power savings are to be realized. For example, a first set of functional tests can be run while iteratively lowering an input voltage corresponding to a first voltage/power domain of SoC device 630. A second set of functional tests can then be run while iteratively lowering a second input voltage corresponding to a second voltage/power domain of SoC device 630. When the second set of functional tests are performed for the second input voltage, the first voltage can be set to a value found during the first functional tests or to a default value, among others.

Advantageously, end-of-line (EoL) voltage margin need not be added during manufacturing test or upon initial shipment of computing system 600. EoL margin can be added if desired, such as 10 to 50 millivolts (mV), among other values, or can be added after later in-situ testing described below. EoL margins are typically added in integrated circuit systems to provide sufficient guardband as associated silicon timing paths in the integrated circuit slow down over time with use. Although the amount of margin typically employed for EoL is only perhaps 15-30 mV (depending upon operating conditions, technology attributes, and desired life time), the systems described herein can eliminate this margin initially, either partially or entirely. In some examples, an initial voltage margin is employed incrementally above the Vmin at an initial time, and later, as the system operates during normal usage, further EoL margin can be incrementally added proportional to the total operational time (such as in hours) of a system or according to operational time for individual voltage domains. Thus, extra voltage margin is recovered from SoC device 630 after the initial voltage adjustment process, and any necessary margin for EoL can be staged back over the operational lifetime of SoC device 630. Moreover, by operating a user system at lower voltages for a longer period of time, system reliability is further improved. These benefits might taper off over the course of time as the EoL margin is staged back in, but it will improve the initial experience.

FIG. 8 also illustrates graph 850 that show how a voltage adjustment process might progress. Graph 850 can illustrate one example voltage minimization operation for operation 815 of FIG. 8. Graph 850 shows a 'downward' incremental Vmin search using progressively lowered voltages, with safety margin added at the end of the process to establish an operational voltage, $V_{OP}$. Later margin ($V_{EOL}$) can be staged in to account for EoL concerns. Specifically, graph 850 shows a default or initial voltage level $V_0$ applied to SoC device 630. After a linger time for a functional test, a successful outcome prompts an incremental lowering to $V_1$ and retesting under the functional test. Further incremental lowering can be performed for each successful iteration of the functional test for an associated time indicated in graph 850. Finally, a lowest or reduced operating voltage is found at $V_3$ and optional margin is applied to establish $V_{OP}$. $V_{OP}$ is employed for the normal operation of the system processor for a period of operational time indicated by $t_5$. This time can occur while an associated system is deployed on-site. After a designated number of hours indicated by $t_5$, EoL margin can be staged in to established $V_{EOL}$. Multiple stages of EoL margin can occur, although only one is shown in graph 850 for clarity.

The voltage levels indicated in graph 850 can vary and depend upon the actual voltage levels applied to a system processor. For example, for a voltage domain of SoC device 630 operating around 0.9V, a reduced voltage level can be discovered using the processes in graph 850. Safety margin of 50 mV might be added in graph 850 to establish $V_{OP}$ and account for variation in user applications and device aging that will occur over time. However, depending upon the operating voltage, incremental step size, and aging considerations, other values could be chosen. In contrast to the downward voltage search in graph 850, an upward voltage search process can instead be performed. An upward voltage search process uses progressively raised voltages to establish an operational voltage, $V_{OP}$. Later margin ($V_{EOL}$) can be staged in to account for EoL concerns.

The processes in graph 850 can be executed independently for each power supply or power domain associated with SoC device 630. Running the procedure on one power supply or power domain at a time can allow for discrimination of which power supply or power domain is responsible for a system failure when looking for the Vmin of each domain. However, lowering multiple voltages for power supplies or power domains at the same time can be useful for reducing test times, especially when failure can be distinguished among the various power supplies or power domains. In further examples, a 'binary' voltage adjustment/search algorithm can be used to find the Vmin by reducing the voltage halfway to an anticipated Vmin as opposed to stepping in the increments of graph 850. In such examples, a Vmin further testing might be needed by raising the voltage once a failure occurred and successfully running system tests at that raised value. Other voltage adjustment/search techniques could be used and the techniques would not deviate from the operations to establish a true Vmin in manufacturing processes that can then be appropriately adjusted to provide a reasonable margin for end user operation.

Any of the aforementioned implementations can have an alternative power flow configuration than shown in the preceding Figures. Power from power supply circuitry 113/413 or input power conditioning elements 619 might be provided to an integrated circuit device, such as an SoC device, at a first voltage level, and one or more voltage control units within the integrated circuit device can comprise voltage regulation or voltage conversion elements that alter the first voltage level into one or more second voltage levels for one or more power domains of the integrated circuit device. These second voltage levels might be routed to internal processing cores and logic structures within the integrated circuit device, as well as to one or more external connections. In many examples, the first voltage level is higher than the second voltage level. The external connections can be provided with conductive pads for coupling to solder balls between the integrated circuit device and a carrier circuit board. The carrier circuit board can have further electrical connections for one or more decoupling capacitors external to the integrated circuit device. Any of the structures, configurations, and arrangements described herein for decoupling capacitance might be employed in integrated circuit devices with internal voltage regulation elements. As such, all internally generated supplies of an integrated circuit device could be provided with improved capacitive decoupling to improve performance by at least providing a reduction in noise, transients, and other effects within voltage domains of the integrated circuit device.

Certain inventive aspects may be appreciated from the foregoing disclosure, of which the following are various examples.

Example 1: An assembly, comprising a first circuit assembly comprising a first circuit board coupled to an integrated circuit device, where the first circuit board is coupled to first surface of a system circuit board, and a second circuit assembly comprising a second circuit board having one or more voltage adjustment units configured to supply at least one input voltage to the integrated circuit device, where the second circuit board is coupled to a second surface of the system circuit board and positioned at least partially under a footprint of the integrated circuit device with respect to the system circuit board.

Example 2: The assembly of Example 1, comprising the second circuit assembly comprising decoupling capacitance for the at least one input voltage of the integrated circuit device.

Example 3: The assembly of Examples 1-2, comprising an integrated device coupled to the second circuit board. The second circuit board comprising the one or more voltage adjustment units, and semiconductor capacitance elements that provide the decoupling capacitance for the at least one supply voltage of the integrated circuit device.

Example 4: The assembly of Examples 1-3, where the one or more voltage adjustment units are configured to receive at least a supply voltage and convert the supply voltage into the at least one input voltage, and wherein the one or more voltage adjustment units are configured to receive control signaling indicating a voltage level of the at least one input voltage.

Example 5: The assembly of Examples 1-4, comprising a power control system configured to initiate a performance test on the integrated circuit device to determine a resultant operating voltage lower than a manufacturer specified operating voltage for the at least one input voltage, and instruct the one or more voltage adjustment units to supply a voltage level of the at least one input voltage to the integrated circuit device in accordance with the resultant operating voltage.

Example 6: The assembly of Examples 1-5, where the performance test comprises iteratively booting the integrated circuit device into an operating system after reducing a voltage level of the at least one input voltage applied to at least one voltage domain of the integrated circuit device. For each reduction in the at least one input voltage, performance test comprises executing a voltage characterization service to perform one or more functional tests that run one or more application level processes in the operating system and exercise processor core elements and interface elements of the integrated circuit device which share the at least one input voltage. The performance test comprises monitoring for operational failures of at least the integrated circuit device during execution of the voltage characterization service. Based at least on the operational failures, performance test comprises determining the resultant input voltage.

Example 7: The assembly of Examples 1-6, where the iterative booting of the integrated circuit device comprises establishing a minimum operating voltage for the at least one input voltage based on a current value of the iteratively reduced voltages, adding a voltage margin to the minimum operating voltage to establish the resultant input voltage, and instructing the one or more voltage adjustment units to supply the resultant input voltage to the integrated circuit device for operation of the integrated circuit device.

Example 8: The assembly of Examples 1-7, comprising the system circuit board comprising a plurality of vias configured to conductively couple the at least one input voltage between the first circuit assembly and the second circuit assembly, and the second circuit assembly further comprising decoupling capacitance for the at least one input voltage of the integrated circuit device, the decoupling capacitance electrically coupled to at least a portion of the plurality of vias.

Example 9: The assembly of Examples 1-8, where the integrated circuit device comprises a plurality of voltage domains each having a corresponding set of input power connections to receive separate input power instances from the system circuit board. The assembly further comprises outputs of the one or more voltage adjustment units conductively coupled through the system circuit board to deliver the corresponding set of input power connections, and decoupling capacitance positioned onto the second circuit assembly and arranged into sets of capacitor elements, each of the sets configured to provide a portion of the decoupling capacitance for the corresponding set of the input power connections.

Example 10: An apparatus, comprising a motherboard, and a carrier circuit board for an integrated circuit device coupled to a first surface of the motherboard. The apparatus includes a circuit assembly comprising a circuit board having decoupling capacitance for the integrated circuit device and one or more voltage adjustment units configured to supply at least one input voltage to the integrated circuit device, where the circuit assembly is positioned at least partially opposite to the carrier circuit board on a second surface of the motherboard.

Example 11: The apparatus of Example 10, comprising the circuit assembly comprising decoupling capacitance for the at least one input voltage of the integrated circuit device.

Example 12: The apparatus of Examples 10-11, comprising an integrated device coupled to the circuit board of the circuit assembly. The integrated device comprises the one or more voltage adjustment units, and semiconductor capacitance elements that provide the decoupling capacitance for the at least one supply voltage of the integrated circuit device.

Example 13: The apparatus of Examples 10-12, where the one or more voltage adjustment units are configured to receive at least a supply voltage and convert the supply voltage into the at least one input voltage, and wherein the one or more voltage adjustment units are configured to receive control signaling from the integrated circuit device indicating a voltage level of the at least one input voltage.

Example 14: The apparatus of Examples 10-13, comprising a power control system configured to initiate a performance test on the integrated circuit device to determine a resultant operating voltage lower than a manufacturer specified operating voltage for the at least one input voltage, and instruct the one or more voltage adjustment units to supply a voltage level of the at least one input voltage to the integrated circuit device in accordance with the resultant operating voltage.

Example 15: The assembly of Examples 10-14, where the performance test comprises iteratively booting the integrated circuit device into an operating system after reducing a voltage level of the at least one input voltage applied to at least one voltage domain of the integrated circuit device. For each reduction in the at least one input voltage, the performance test comprises executing a voltage characterization service to perform one or more functional tests that run one or more application level processes in the operating system and exercise processor core elements and interface elements of the integrated circuit device which share the at least one input voltage. The performance test comprises monitoring for operational failures of at least the integrated circuit device during execution of the voltage characterization service. Based at least on the operational failures, the performance test comprises determining the resultant input voltage.

Example 16: The apparatus of Examples 10-15, where the iterative booting of the integrated circuit device comprises establishing a minimum operating voltage for the at least one input voltage based on a current value of the iteratively reduced voltages, adding a voltage margin to the minimum operating voltage to establish the resultant input voltage, and instructing the one or more voltage adjustment units to supply the resultant input voltage to the integrated circuit device for operation of the integrated circuit device.

Example 17: The apparatus of Examples 10-16, comprising the motherboard comprising a plurality of vias configured to conductively couple the at least one input voltage between the carrier circuit board and the circuit assembly, and the circuit assembly further comprising decoupling capacitance for the at least one input voltage of the integrated circuit device, the decoupling capacitance electrically coupled to at least a portion of the plurality of vias.

Example 18: The apparatus of Examples 10-17, where the integrated circuit device comprises a plurality of voltage domains each having a corresponding set of input power connections to receive separate input power instances from the motherboard. The apparatus comprises outputs of the one or more voltage adjustment units conductively coupled through the motherboard to deliver the corresponding set of input power connections, and decoupling capacitance positioned onto the circuit assembly and arranged into sets of capacitor elements, each of the sets configured to provide a portion of the decoupling capacitance for the corresponding set of the input power connections.

Example 19: A circuit arrangement, comprising a motherboard, a system on a chip (SoC) device coupled to a first surface of the motherboard, and a circuit board assembly comprising decoupling capacitance for the SoC device and one or more voltage adjustment units configured to supply at least one input voltage to the SoC device, where the circuit assembly is positioned at least partially opposite to the SoC device on a second surface of the motherboard.

Example 20: The circuit arrangement of Example 19, comprising an integrated device coupled to the circuit board assembly. The integrated device comprises the one or more voltage adjustment units and semiconductor capacitance elements that provide the decoupling capacitance for the at least one supply voltage of the SoC device. The SoC device can comprise a power control system configured to initiate a performance test on the SoC device to determine a resultant operating voltage lower than a manufacturer specified operating voltage for the at least one input voltage, and instruct the one or more voltage adjustment units to supply a voltage level of the at least one input voltage to the SoC device in accordance with the resultant operating voltage.

The functional block diagrams, operational scenarios and sequences, and flow diagrams provided in the Figures are representative of exemplary systems, environments, and methodologies for performing novel aspects of the disclosure. The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

What is claimed is:

1. An assembly, comprising:
a target integrated circuit device coupled to a first surface of a system circuit board;
a power integrated circuit device coupled to a second surface of the system circuit board and positioned under a footprint of the target integrated circuit device with respect to the system circuit board; and
the power integrated circuit device comprising a semiconductor die having one or more voltage adjustment units configured to supply at least one input voltage to the target integrated circuit device and having integrated decoupling capacitance for the at least one input voltage of the target integrated circuit device.

2. The assembly of claim 1,
wherein the target integrated circuit device is mounted to a first carrier circuit board that couples to the first surface of the system circuit board; and
wherein the power integrated circuit device is mounted to a second carrier circuit board that couples to the second surface of the system circuit board.

3. The assembly of claim 1, wherein the one or more voltage adjustment units are configured to receive at least a supply voltage and convert the supply voltage into the at least one input voltage, and wherein the one or more voltage adjustment units are configured to receive control signaling indicating a voltage level of the at least one input voltage.

4. The assembly of claim 1, comprising:
a power control system configured to initiate a performance test on the target integrated circuit device to determine a resultant operating voltage lower than a manufacturer specified operating voltage for the at least one input voltage, and instruct the one or more voltage adjustment units to supply a voltage level of the at least one input voltage to the target integrated circuit device in accordance with the resultant operating voltage.

5. The assembly of claim 4, wherein the performance test comprises:
iteratively booting the target integrated circuit device into an operating system after reducing a voltage level of the at least one input voltage applied to at least one voltage domain of the target integrated circuit device;
for each reduction in the at least one input voltage, executing a voltage characterization service to perform one or more functional tests that run one or more application level processes in the operating system and exercise processor core elements and interface elements of the target integrated circuit device which share the at least one input voltage;
monitoring for operational failures of at least the target integrated circuit device during execution of the voltage characterization service; and
based at least on the operational failures, determining the resultant input voltage.

6. The assembly of claim 5, wherein the iterative booting of the target integrated circuit device comprises establishing a minimum operating voltage for the at least one input voltage based on a current value of the iteratively reduced voltages, adding a voltage margin to the minimum operating voltage to establish the resultant input voltage, and instructing the one or more voltage adjustment units to supply the resultant input voltage to the target integrated circuit device for operation of the target integrated circuit device.

7. The assembly of claim 1, comprising:
the system circuit board comprising a plurality of vias configured to conductively couple the at least one input voltage between the target integrated circuit device and the power integrated circuit device; and
wherein the decoupling capacitance electrically coupled to at least a portion of the plurality of vias.

8. The assembly of claim 1, wherein the target integrated circuit device comprises a plurality of voltage domains each having a corresponding set of input power connections to receive separate input power instances from the system circuit board; and comprising:
outputs of the one or more voltage adjustment units conductively coupled through the system circuit board to deliver the corresponding set of input power connections; and
the decoupling capacitance is arranged into sets of capacitor elements, each of the sets configured to provide a portion of the decoupling capacitance for the corresponding set of the input power connections.

9. An apparatus, comprising:
a motherboard;
a first carrier circuit board that carries a target integrated circuit device and is coupled to a first surface of the motherboard;
a second carrier circuit board that carries a power integrated circuit device and is coupled to a second surface of the motherboard and positioned opposite a footprint of the first carrier circuit board on the motherboard; and
a power integrated circuit device comprising a semiconductor die having one or more voltage adjustment units configured to supply at least one input voltage to the integrated circuit device and having integrated decoupling capacitance for the at least one input voltage of the integrated circuit device.

10. The apparatus of claim 9,
wherein the integrated decoupling capacitance comprises semiconductor capacitance elements.

11. The apparatus of claim 9, wherein the one or more voltage adjustment units are configured to receive at least a supply voltage and convert the supply voltage into the at least one input voltage, and wherein the one or more voltage adjustment units are configured to receive control signaling from the target integrated circuit device indicating a voltage level of the at least one input voltage.

12. The apparatus of claim 9, comprising:
a power control system configured to initiate a performance test on the target integrated circuit device to determine a resultant operating voltage lower than a manufacturer specified operating voltage for the at least one input voltage, and instruct the one or more voltage adjustment units to supply a voltage level of the at least one input voltage to the target integrated circuit device in accordance with the resultant operating voltage.

13. The assembly of claim 12, wherein the performance test comprises:
iteratively booting the target integrated circuit device into an operating system after reducing a voltage level of the at least one input voltage applied to at least one voltage domain of the target integrated circuit device;
for each reduction in the at least one input voltage, executing a voltage characterization service to perform one or more functional tests that run one or more application level processes in the operating system and exercise processor core elements and interface elements of the target integrated circuit device which share the at least one input voltage;

monitoring for operational failures of at least the target integrated circuit device during execution of the voltage characterization service; and based at least on the operational failures, determining the resultant input voltage.

14. The apparatus of claim 13, wherein the iterative booting of the target integrated circuit device comprises establishing a minimum operating voltage for the at least one input voltage based on a current value of the iteratively reduced voltages, adding a voltage margin to the minimum operating voltage to establish the resultant input voltage, and instructing the one or more voltage adjustment units to supply the resultant input voltage to the target integrated circuit device for operation of the target integrated circuit device.

15. The apparatus of claim 9, comprising:

the motherboard comprising a plurality of vias configured to conductively couple the at least one input voltage between the first carrier circuit board and the second carrier circuit board; and wherein the decoupling capacitance is electrically coupled to at least a portion of the plurality of vias.

16. The apparatus of claim 9, wherein the target integrated circuit device comprises a plurality of voltage domains each having a corresponding set of input power connections to receive separate input power instances from the motherboard; and comprising:

outputs of the one or more voltage adjustment units conductively coupled through the motherboard to deliver the corresponding set of input power connections; and the decoupling capacitance arranged into sets of capacitor elements, each of the sets configured to provide a portion of the decoupling capacitance for the corresponding set of the input power connections.

17. A circuit arrangement, comprising:

a motherboard;

a system on a chip (SoC) device coupled to a first surface of the motherboard;

a circuit assembly comprising a power integrated circuit device coupled to a second surface of the motherboard opposite a footprint of the SoC device; and the power integrated circuit device comprising a semiconductor die having decoupling capacitance for at least one input voltage of the SoC device and having one or more voltage adjustment units configured to supply the at least one input voltage to the SoC device.

18. The circuit arrangement of claim 17, comprising:

the power integrated circuit device comprising:

the one or more voltage adjustment units; and semiconductor capacitance elements that provide the decoupling capacitance for the at least one supply voltage of the SoC device; and the SoC device comprising a power control system configured to conduct a performance test on the SoC device to determine a resultant operating voltage lower than a manufacturer specified operating voltage for the at least one input voltage, and instruct the one or more voltage adjustment units to supply a voltage level of the at least one input voltage to the SoC device in accordance with the resultant operating voltage.

* * * * *